(12) United States Patent
Jin et al.

(10) Patent No.: US 10,868,070 B2
(45) Date of Patent: Dec. 15, 2020

(54) IMAGE SENSORS WITH MULTIPLE LENSES PER PIXEL REGION

(71) Applicant: Samsung Electronics Co., Ltd., Suwon-si (KR)

(72) Inventors: Young Gu Jin, Suwon-si (KR); Young Chan Kim, Seongnam-si (KR); Min-Sun Keel, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/206,118

(22) Filed: Nov. 30, 2018

(65) Prior Publication Data

US 2019/0296070 A1 Sep. 26, 2019

(30) Foreign Application Priority Data

Mar. 20, 2018 (KR) .................. 10-2018-0031897

(51) Int. Cl.
| | |
|---|---|
| H01L 27/146 | (2006.01) |
| H04N 13/254 | (2018.01) |
| H04N 13/00 | (2018.01) |
| H04N 5/3745 | (2011.01) |

(52) U.S. Cl.
CPC .... *H01L 27/14627* (2013.01); *H01L 27/1463* (2013.01); *H01L 27/14625* (2013.01); *H01L 27/14643* (2013.01); *H04N 13/254* (2018.05); *H01L 27/1464* (2013.01); *H01L 27/14621* (2013.01); *H04N 2013/0077* (2013.01); *H04N 2013/0081* (2013.01)

(58) Field of Classification Search
CPC ......... H01L 27/14627; H01L 27/14643; H01L 27/1463; H01L 27/14625; H01L 27/14641; H01L 27/1464; H01L 27/14621; H04N 5/23212
See application file for complete search history.

(56) References Cited

U.S. PATENT DOCUMENTS

| | | | |
|---|---|---|---|
| 7,646,551 B2 | 1/2010 | Li et al. | |
| 7,916,204 B2 | 3/2011 | Wells et al. | |
| 8,704,935 B2 | 4/2014 | Boettiger | |
| 9,673,239 B1* | 6/2017 | Chu | .................. H01L 27/14607 |
| 2014/0103412 A1* | 4/2014 | Lee | ................... H01L 27/14605 257/292 |
| 2016/0204143 A1* | 7/2016 | Lee | ..................... H01L 27/1463 257/229 |
| 2017/0117309 A1* | 4/2017 | Chen | ................. H01L 27/14643 |

(Continued)

FOREIGN PATENT DOCUMENTS

| | | |
|---|---|---|
| JP | 2015-167219 | 9/2015 |
| JP | 2017-108062 | 6/2017 |

(Continued)

*Primary Examiner* — Mohsen Ahmadi
(74) *Attorney, Agent, or Firm* — Myers Bigel, P.A.

(57) ABSTRACT

Image sensors are provided. An image sensor includes a substrate that includes a pixel region, a first surface, and a second surface that is opposite the first surface. The image sensor includes first and second photogates that are on the first surface and are configured to generate electric charge responsive to incident light in the pixel region. Moreover, the image sensor includes first and second lenses that are on the second surface and are configured to pass the incident light toward the first and second photogates.

17 Claims, 23 Drawing Sheets

(56) References Cited

U.S. PATENT DOCUMENTS

| | | | |
|---|---|---|---|
| 2017/0236858 A1* | 8/2017 | Oh | H01L 27/14612 |
| | | | 257/292 |
| 2017/0317117 A1* | 11/2017 | Ukigaya | H01L 27/14627 |
| 2017/0330905 A1* | 11/2017 | Tak | H01L 27/14621 |
| 2017/0373108 A1* | 12/2017 | Hwangbo | H01L 27/14621 |
| 2018/0151759 A1* | 5/2018 | Huang | H01L 31/02002 |
| 2018/0219040 A1* | 8/2018 | Choi | H01L 27/14649 |
| 2018/0374884 A1* | 12/2018 | Cheng | H01L 27/14623 |
| 2019/0067354 A1* | 2/2019 | Cheng | H01L 27/14629 |
| 2019/0165026 A1* | 5/2019 | Kuo | H01L 27/1464 |
| 2019/0214420 A1* | 7/2019 | Kim | H01L 27/14627 |

FOREIGN PATENT DOCUMENTS

| | | |
|---|---|---|
| JP | 2017-126671 | 7/2017 |
| WO | 2015/122300 | 8/2015 |
| WO | 2017/098830 | 6/2017 |

\* cited by examiner

IMAGE SENSORS WITH MULTIPLE LENSES PER PIXEL REGION

CROSS-REFERENCE TO RELATED APPLICATION

This application claims the benefit of Korean Patent Application No. 10-2018-0031897, filed on Mar. 20, 2018, in the Korean Intellectual Property Office, the disclosure of which is hereby incorporated herein in its entirety by reference.

BACKGROUND

The present disclosure relates to image sensors. As digital cameras, digital camcorders, and mobile phones including the functions of the digital cameras and the digital camcorders become widespread, image sensors are being rapidly developed. An image sensor is a semiconductor device that converts an optical image into an electrical signal. With the demand for stereoscopic images, research is being actively conducted on a three-dimensional (3D) image sensor, that is, a depth sensor capable of simultaneously capturing a two-dimensional (2D) image and a depth image.

A depth sensor may have larger pixels than a conventional image sensor. Accordingly, the size of microlenses may be increased, which, however, may increase the manufacturing difficulty of the microlenses, thereby increasing production costs and lowering device reliability.

SUMMARY

Aspects of the present disclosure provide an image sensor having improved production efficiency and photoelectric efficiency by applying a plurality of microlenses to one pixel.

An image sensor, according to some embodiments, may include a substrate that includes a pixel region, a first surface, and a second surface that is opposite the first surface. The image sensor may include first and second photogates that are on the first surface and are configured to generate electric charge responsive to incident light in the pixel region. Moreover, the image sensor may include first and second microlenses that share a pixel including the pixel region, are on the second surface, and are configured to pass the incident light toward the first and second photogates.

An image sensor, according to some embodiments, may include a substrate that includes a pixel region, a first surface, and a second surface that is opposite the first surface. The image sensor may include first and second photogates on the first surface and configured to generate electric charge responsive to incident light in the pixel region. The image sensor may include a trench isolation layer that defines the pixel region. The image sensor may include first and second scattering structures that are configured to scatter the incident light in the pixel region. Moreover, the image sensor may include first and second lenses on the second surface and configured to pass the incident light into the pixel region. The first scattering structure and the first lens may vertically overlap each other, and the second scattering structure and the second lens may vertically overlap each other.

An image sensor, according to some embodiments, may include a substrate that includes a pixel region, a first surface, and a second surface that is opposite the first surface. The image sensor may include first and second photogates on the first surface and configured to generate electric charge responsive to incident light in the pixel region. The image sensor may include a shallow trench isolation (STI) layer that extends a first distance in a direction from the first surface toward the second surface in the pixel region. The image sensor may include a deep trench isolation (DTI) layer that defines the pixel region and extends a second distance in the direction. The second distance may be longer than the first distance. Moreover, the image sensor may include first and second lenses on the second surface and configured to pass the incident light into the pixel region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
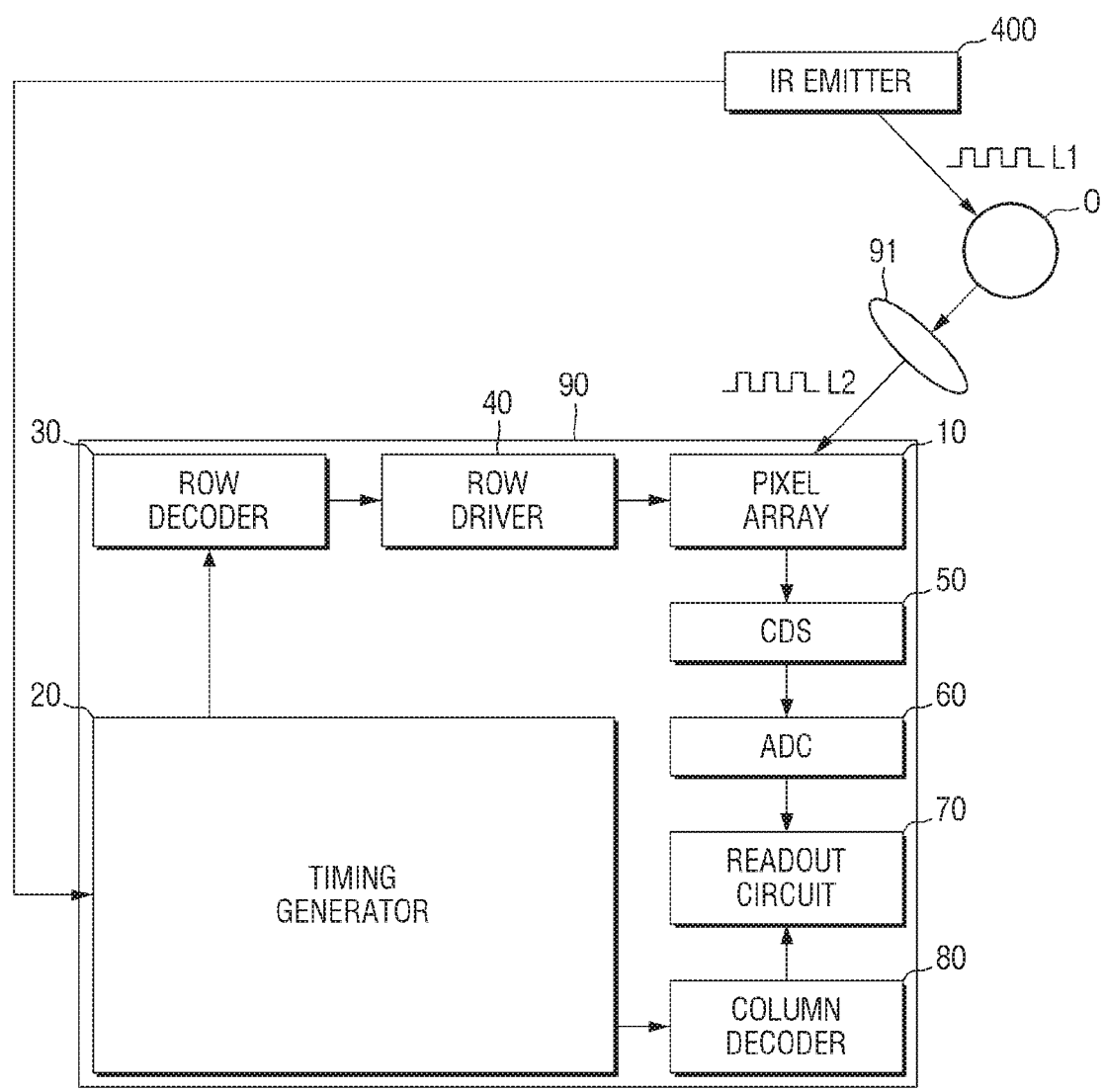
FIG. 1 is a block diagram of an image sensor according to embodiments.

Hereinafter, embodiments of the present disclosure will be explained with reference to the accompanying drawings. Like reference numerals in the drawings denote like elements, and redundant explanations of like elements may be omitted.

A three-dimensional (3D) image sensor according to embodiments will now be described with reference to FIGS. 1 through 7.

FIG. 1 is a block diagram of an image sensor according to embodiments.

Referring to FIG. 1, an image sensing apparatus including an image sensor according to embodiments includes an infrared emitter 400 and a 3D image sensor 90.

The infrared emitter 400 may irradiate a pulse signal L1 to an object O. The pulse signal L1 may be infrared light. The pulse signal L1 may be reflected by the object O, and the reflected pulse signal L2 may enter the 3D image sensor 90 through a lens 91. The infrared emitter 400 may transmit information about the pulse signal L1 to the 3D image sensor 90.

The 3D image sensor 90 may analyze color information and distance information, that is, 3D image information of the object O using the reflected pulse signal L2.

Specifically, the 3D image sensor 90 includes a pixel array 10 in which pixels including photoelectric devices are arranged in a two-dimensional manner, a timing generator 20, a row decoder 30, a row driver 40, a correlated double sampler (CDS) 50, an analog-to-digital converter (ADC) 60, a readout circuit 70, and a column decoder 80.

The pixel array 10 includes a plurality of pixels arranged two-dimensionally. Each of the pixels converts an optical image into an electrical output signal. The pixel array 10 may receive the reflected pulse signal L2 through the lens 91.

The pixel array 10 is driven by a plurality of driving signals (such as a row selection signal, a reset signal, and a charge transfer signal) received from the row driver 40. In addition, the electrical output signal is provided to the CDS 50 through a vertical signal line.

The timing generator 20 provides a timing signal and a control signal to the row decoder 30 and the column decoder 80. The timing generator 20 may receive the information about the pulse signal L1 from the infrared emitter 400.

The row decoder 30 generates driving signals for driving each row of the pixel array 10, such as a transfer signal, a reset signal and a selection signal, and a gate signal.

The row driver 40 provides a plurality of driving signals for driving a plurality of unit pixels of the pixel array 10 according to the decoding result of the row decoder 30. In general, when the unit pixels are arranged in a matrix form, the driving signals are provided to each row.

The CDS 50 receives an output signal from the pixel array 10 through a vertical signal line and holds and samples the output signal. That is, the CDS 50 may double-sample a certain noise level and a signal level of the output signal and outputs a difference level corresponding to a difference between the noise level and the signal level.

The ADC 60 converts an analog signal corresponding to the difference level into a digital signal and outputs the digital signal.

The readout circuit 70 processes the digital signal according to the decoding result of the column decoder 80. The readout circuit 70 may derive color information and depth information of an image by processing the digital signal.

Figure 2:
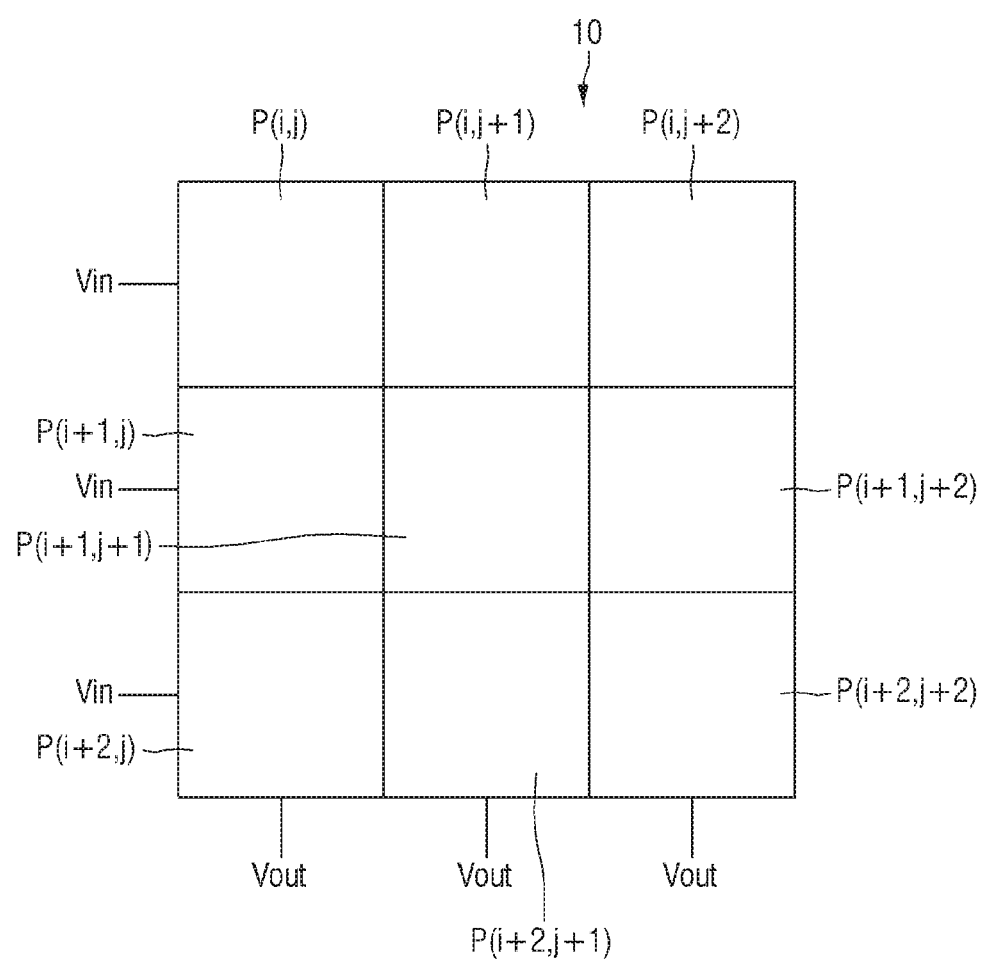
FIG. 2 is a layout view illustrating a pixel array of FIG. 1 in detail.

FIG. 2 is a layout view illustrating the pixel array 10 of FIG. 1 in detail.

Referring to FIG. 2, the pixel array 10 may have a plurality of pixels aligned in rows and columns. In FIG. 2, a pixel located in an $i^{th}$ row and a $j^{th}$ column is indicated by P(i, j). Although only three rows and three columns are illustrated in FIG. 2 for convenience, this is a non-limiting example. That is, the number of rows and the number of columns may vary.

The horizontal shape of the pixel P(i, j) may be, but is not limited to, a square. The pixel P(i, j) may be in contact with an adjacent pixel through a surface of the square.

The pixel P(i, j) may receive an input Vin and produce an output Vout. Here, the input Vin may be supplied equally to each row of the pixel array 10, and the output Vout may be produced from each column of the pixel array 10.

Figure 3:
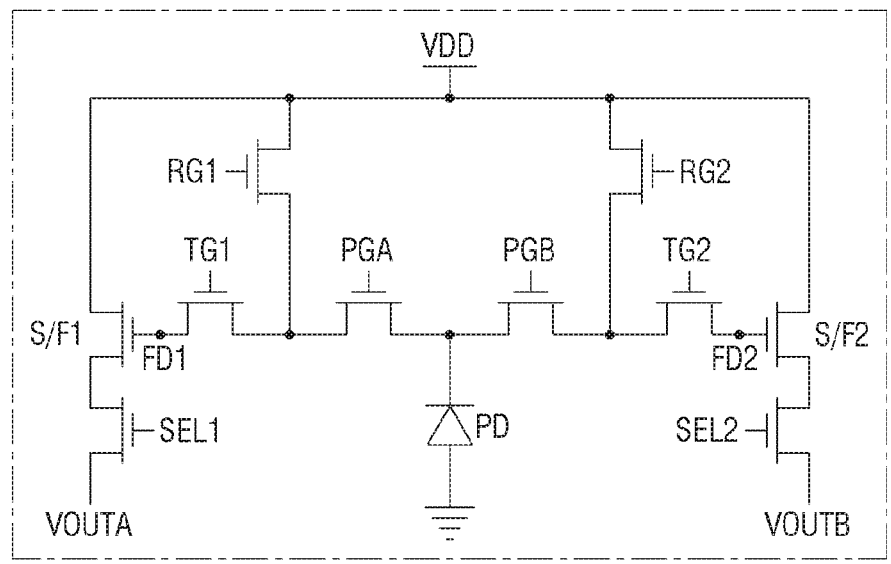
FIG. 3 is an equivalent circuit diagram illustrating one pixel region in the pixel array of FIG. 1 in detail.

FIG. 3 is an equivalent circuit diagram illustrating one pixel region (e.g., one pixel) the pixel array 10 of FIG. 1 in detail.

Referring to FIG. 3, a pixel P(i, j) may be a 2-tap pixel having two photogates, however the present disclosure is not limited thereto. For example, the pixel included in the image sensor may be a 3-tap pixel having three photogates or a 4-tap pixel having four photogates.

The pixel P(i, j) may include a photoelectric device PD, a first photogate PGA and a second photogate PGB. In addition, the pixel P(i, j) may include a first transfer transistor TG1, a second transfer transistor TG2, a first reset transistor RG1, a second reset transistor RG2, a first source follower S/F1, a second source follower S/F2, a first select transistor SEL1, and a second select transistor SEL2.

The photoelectric device PD may be a device that converts incident light into electric charge. The photoelectric device PD may convert light into an electrical signal in association with the first photogate PGA and the second photogate PGB.

Specifically, the photoelectric device PD may sense light. The photoelectric device PD generates electron-hole pairs from the sensed light. A depletion region is formed by a gate voltage applied to the first photogate PGA, electrons and holes in the electron-hole pairs are separated by the depletion region, and the electrons accumulate under the first photogate PGA.

The first transfer transistor TG1 has a drain connected to the first photogate PGA and a source connected to a first floating diffusion region FD1. The first transfer transistor TG1 transfers the electrons under the first photogate PGA in response to a gate voltage. The first transfer transistor TG1 electrically connects or disconnects the first photogate PGA and the first floating diffusion region FD1 in response to a gate signal.

The first source follower S/F1 has a gate connected to the first floating diffusion region FD1, a drain connected to a power supply voltage VDD, and a source connected to the first select transistor SEL1. The voltage of the source terminal of the first source follower S/F1 is determined by the voltage of the first floating diffusion region FD1, The voltage of the first floating diffusion region FD1 is determined by the amount of electrons transferred from the first photogate PGA.

The first select transistor SEL1 has a gate connected to a row control signal, a drain connected to the source of the first source follower S/F1, and a source connected to an output line in the pixel array 10.

The first reset transistor RG1 has a drain connected to the power supply voltage VDD and a source connected to the first floating diffusion region FD1. After a pixel information detection process is performed based on the voltage of the first floating diffusion region FD1, when a first reset signal is activated at a gate of the first reset transistor RG1, the first reset transistor RG1 resets the voltage of the first floating diffusion region FD1 to the power supply voltage VDD.

When the photoelectric device PD senses light, a depletion region is formed by a gate voltage applied to the second photogate PGB, electrons and holes in electron-hole pairs are separated by the depletion region, and the electrons accumulate under the second photogate PGB.

The second transfer transistor TG2 has a drain connected to the second photogate PGB and a source connected to a second floating diffusion region FD2. The second transfer transistor TG2 transfers the electrons under the second photogate PGB in response to a gate voltage. The second transfer transistor TG2 electrically connects or disconnects the second photogate PGB and the second floating diffusion region FD2 in response to a gate signal.

The second source follower S/F2 has a gate connected to the second floating diffusion region FD2, a drain connected to the power supply voltage VDD, and a source connected to the second select transistor SEL2. The voltage of the source terminal of the second source follower S/F2 is determined by the voltage of the second floating diffusion region FD2. The voltage of the second floating diffusion region FD2 is determined by the amount of electrons transferred from the second photogate PGB.

The second select transistor SEL2 has a gate connected to a row control signal, a drain connected to the source of the second source follower S/F2, and a source connected to an output line in the pixel array 10.

The second reset transistor RG2 has a drain connected to the power supply voltage VDD and a source connected to the second floating diffusion region FD2. After a pixel information detection process is performed based on the voltage of the second floating diffusion region FD2, when a second reset signal is activated at a gate of the second reset transistor RG2, the second reset transistor RG2 resets the voltage of the second floating diffusion region FD2 to the power supply voltage VDD.

The pixels P(i, j) of the image sensor according to some embodiments can be configured in a different form from FIG. 3.

Figure 4:
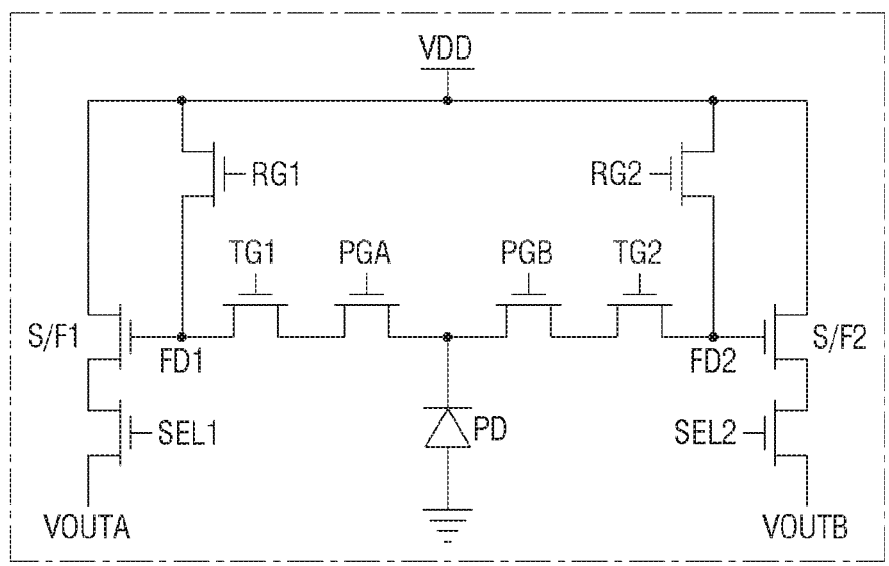
FIG. 4 is an equivalent circuit diagram of a pixel region of a three-dimensional (3D) image sensor according to embodiments.

FIG. 4 is an equivalent circuit diagram of a pixel region of a 3D image sensor according to embodiments.

Referring to FIG. 4, the first reset transistor RG1 may be connected between the first source follower S/F1 and the first transfer transistor TG1, not between the first photogate PGA and the first transfer transistor TG1.

Similarly, the second reset transistor RG2 may be connected between the second source follower S/F2 and the second transfer transistor TG2, not between the second photogate PGB and the second transfer transistor TG2.

That is, the pixel P(i, j) of the 3D image sensor according to some embodiments can be configured in various circuit forms for producing the same result.

Referring to FIGS. 2 through 4, the input Vin may include the power supply voltage VDD and a gate voltage of each transistor. That is, the respective gate voltages of the first photogate PGA, the first transfer transistor TG1, the first reset transistor RG1, the first select transistor SEL1, the second photogate PGB, the second transfer transistor TG2, the second reset transistor RG2 and the second select transistor SEL2 may all be included in the input Vin.

The output Vout may include a first output VOUTA and a second output VOUTB.

Figure 5:
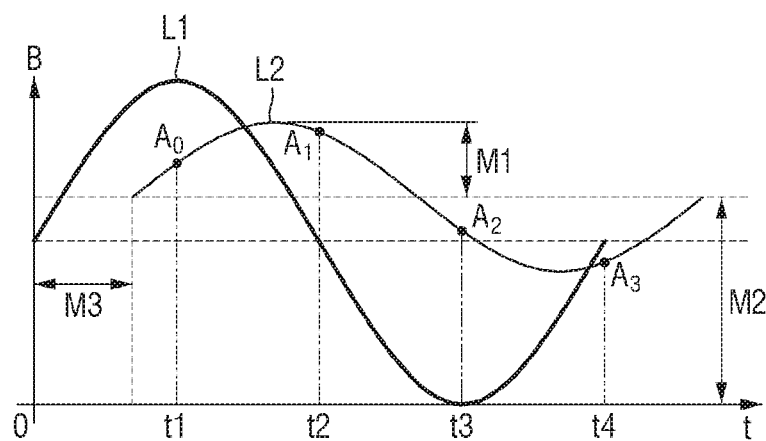
FIG. 5 is a graph for explaining phase sampling of an image sensor according to embodiments.

FIG. 5 is a graph for explaining phase sampling of an image sensor according to embodiments. In FIG. 5, the horizontal axis represents time, and the vertical axis represents brightness. An example of the pulse signal L1 and the reflected pulse signal L2 is shown in the graph of FIG. 5.

Referring to FIGS. 1 and 5, in order to calculate the distance to the object O, the reflected pulse signal L2 may be sampled at four points t1, t2, t3 and t4 where the phase of the pulse signal L1 is 0 degree, 90 degrees, 180 degrees and 270 degrees. Values of $A_0$, $A_1$, $A_2$ and $A_3$ may be measured at the four points t1, t2, t3 and t4, respectively.

In the graph of FIG. 5, a first measured value M1 may provide accuracy information. Also, a second measured value M2 may provide brightness information. Finally, a third measured value M3 may provide distance information.

Using the values of $A_0$, $A_2$ and $A_3$ at the four points t1, t2, t3 and t4, the first measured value M1, the second measured value M2 and the third measured value M3, the 3D image sensor according to embodiments may obtain both the color information and the distance information of the object O.

Figure 6:
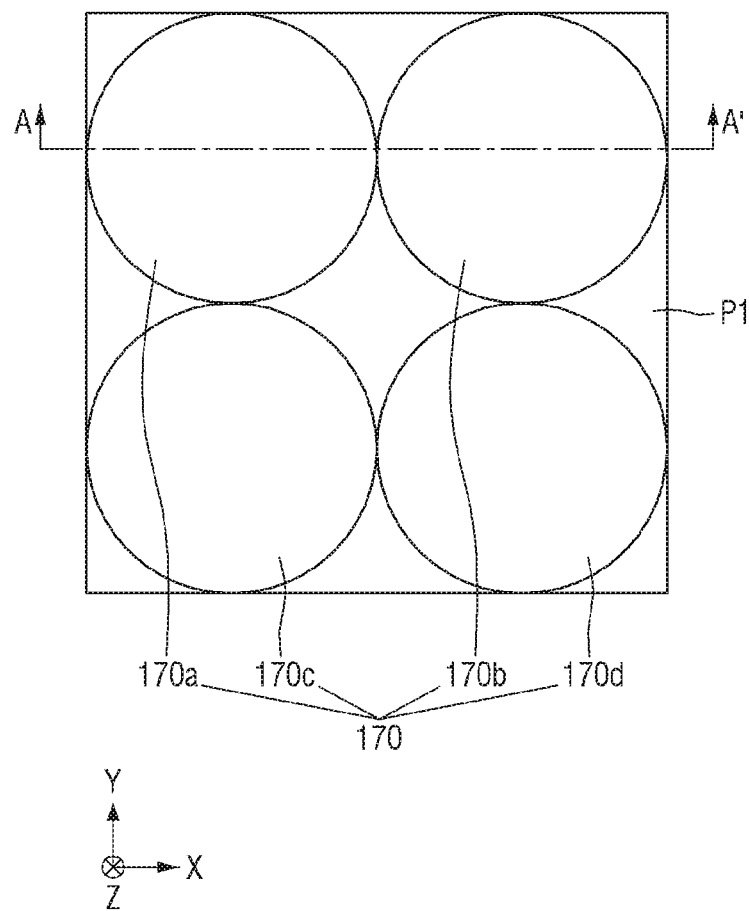
FIG. 6 is a bottom view of an image sensor according to embodiments.

FIG. 6 is a bottom view of an image sensor according to embodiments.

Referring to FIG. 6, the image sensor according to some embodiments may include a first pixel region P1. Here, the first pixel region P1 may be any one of a plurality of aligned pixels.

The first pixel region P1 may include four lenses, such as four microlenses 170. However, this is a non-limiting example, That is, the image sensor according to some embodiments may include two or more lenses/microlenses, and the number of lenses/microlenses may vary.

The microlenses 170 may include a first microlens 170a, a second microlens 170b, a third microlens 170c, and a fourth microlens 170d.

The first microlens 170a and the second microlens 170b may be aligned in a first direction X. The third microlens 170c and the fourth microlens 170d may also be aligned in the first direction X.

In addition, the first microlens 170a and the third microlens 170c may be aligned in a second direction Y. The second microlens 170b and the fourth microlens 170d may be aligned in the second direction Y.

Here, the first direction X may be a direction perpendicular to the second direction Y. A third direction Z may be a direction perpendicular to both the first direction X and the second direction Y. Therefore, the first direction X, the second direction Y, and the third direction Z may be orthogonal to each other.

Figure 7:
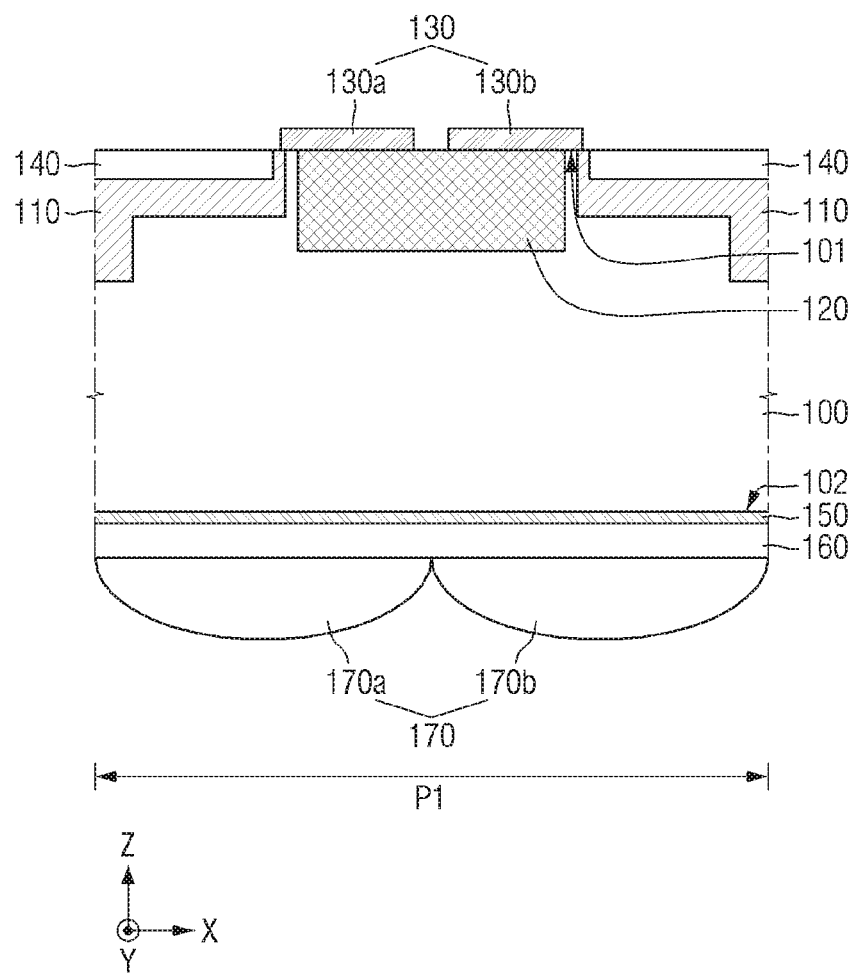
FIG. 7 is a cross-sectional view taken along the line A-A' of FIG. 6.

FIG. 7 is a cross-sectional view taken along the line A-A' of FIG. 6.

Referring to FIG. 7, the image sensor according to some embodiments may include a substrate 100, a photoelectric device 120, a doping well 110, photogates 130, a shallow trench isolation (STI) layer 140, an insulating layer 150, a planarizing layer 160, and a microlens 170.

The substrate 100 includes a first surface 101 and a second surface 102 opposite to each other. The first surface 101 of the substrate 100 may be, but is not limited to, a front side of the substrate 100, and the second surface 102 of the substrate 100 may be, but is not limited to, a back side of the substrate 100.

The substrate 100 may be, e.g., a P-type or N-type bulk substrate, may be formed by growing a P-type or N-type epitaxial layer on a P-type bulk substrate, or may be formed by growing a P-type or N-type epitaxial layer on an N-type bulk substrate. The substrate 100 may also be an organic plastic substrate instead of a semiconductor substrate.

The photoelectric device 120 may correspond to the photoelectric device PD of FIG. 3. The photoelectric device 120 may convert incident light into electric charge, with a first photogate 130a and a second photogate 130b. The first photogate 130a and the second photogate 130b may be configured to generate electric charge responsive to incident light.

The doping well 110 may be formed in the first surface 101 of the substrate 100. The doping well 110 may be formed by doping the substrate 100 with P-type or N-type impurities. The doping well 110 may be formed to form a source and a drain of a transistor.

The photogates 130 may be formed on the photoelectric device 120. The photogates 130 may include the first photogate 130a and the second photogate 130b. The photogates 130 may convert incident light into electric charge, with the photoelectric device 120. The electric charge generated by the photogates 130 may be processed into an electrical signal by the elements illustrated in FIGS. 3 and 4.

The STI layer 140 may be buried in the first surface 101 to isolate devices. That is, a plurality of transistors formed in the first surface 101 may be separated from each other by the STI layer 140 to operate separately. The STI layer 40 may be, but is not necessarily, formed on the doping well 110.

The insulating layer 150 may be formed on the second surface 102 of the substrate 100. The insulating layer 150 may include a low dielectric constant material having a lower dielectric constant than the material of the substrate 100. Examples of the low dielectric constant material include, but are not limited to, flowable oxide (FOX), tonen silazene (TOSZ), undoped silica glass (USG), borosilica glass (BSG), phosphosilica glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, and combinations of the above materials.

The insulating layer 150 may serve as an antireflection layer that minimizes/reduces reflection of incident light. That is, the incident light contains both transmitted and reflected components, and the reflected components may be minimized/reduced to increase the quantum efficiency of the image sensor. Therefore, the insulating layer 150 may minimize/reduce the reflected components, thereby improving the quantum efficiency of the image sensor.

The planarizing layer 160 may be formed on the insulating layer 150. The planarizing layer 160 may include at least one of, for example, a silicon oxide-based material, a silicon nitride-based material, a resin, or a combination of these materials. Although the planarizing layer 160 is illustrated as a single layer, this is merely an example used for ease of description, and the planarizing layer 160 is not limited to the single layer.

The planarizing layer 160 may planarize the surface of the insulating layer 150 before the microlens 170 is formed. In addition, the planarization layer 160 may be formed to protect pixel regions during the process of patterning regions other than the pixel regions.

The microlens 170 may be formed on the planarizing layer 160. The microlens 170 may be upwardly convex (i.e., bulging away from the planarizing layer 160) as illustrated in the drawing. The convex shape of the microlens 170 may cause incident light to be concentrated on the first pixel region P1.

The microlens 170 may be made of an organic material such as photoresist (PR). Alternatively, the microlens 170 may be formed using an inorganic material. Forming the microlens 170 using an organic material may be achieved by forming an organic material pattern on the planarizing layer 160 and performing a thermal process on the organic material pattern to form the microlens 170. The organic material pattern may be changed into the microlens 170 by the thermal process.

The microlens 170 may be provided in plural numbers. Since the image sensor according to some embodiments includes two or more photogates 130 in each pixel, it may have relatively large pixels. Thus, to place one microlens 170 in/on each pixel, the size of the microlens 170 may be increased. However, when the microlens 170 is formed large, it may be difficult to maintain the curvature of the microlens 170. Therefore, forming one microlens 170 in the first pixel region P1 to cover the entire second surface 102 of the substrate 100 may increase production costs and reduce quantum efficiency.

Hence, the image sensor according to some embodiments may have two or more microlenses 170 in/on one pixel. For example, the first microlens 170a and the second microlens 170b may share the same pixel, such as a pixel comprising the first pixel region P1. Accordingly, the first microlens 170a and the second microlens 170b may be disposed on the planarizing layer 160. The first microlens 170a and the second microlens 170b may collect incident light and direct/pass transmit) the collected light toward (e.g., to) the photoelectric device 120 and the photogates 130.

An image sensor according to embodiments will now be described with reference to FIGS. 8 and 9. A description of elements and features identical to those previously described may be simplified or omitted.

Figure 8:
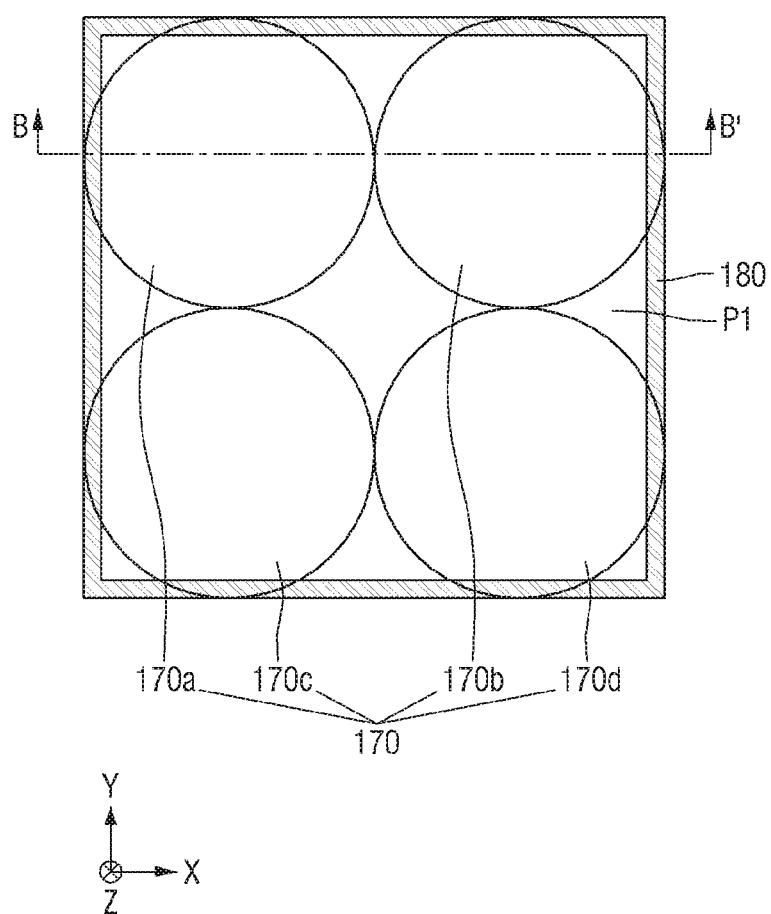
FIG. 8 is a bottom view of an image sensor according to embodiments.
Figure 9:
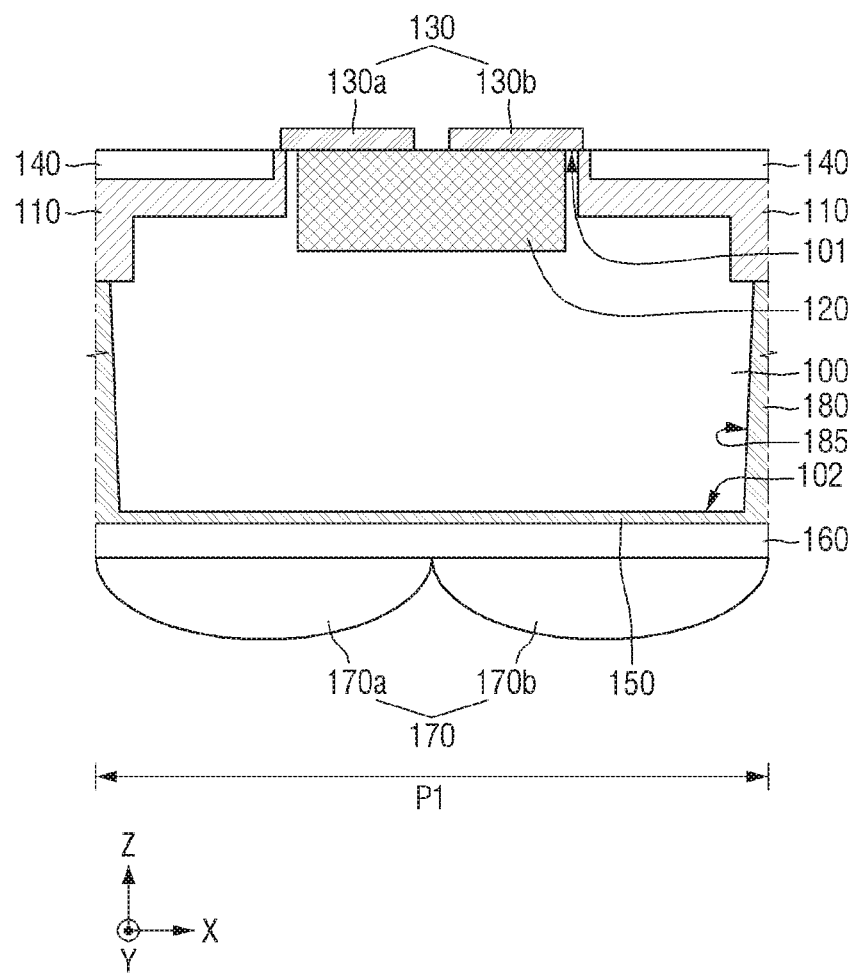
FIG. 9 is a cross-sectional view taken along the line B-B' of FIG. 8.

FIG. 8 is a bottom view of an image sensor according to embodiments, and FIG. 9 is a cross-sectional view taken along the line B-B' of FIG. 8.

Referring to FIGS. 8 and 9, the image sensor according to some embodiments may further include a deep trench 185 and a first deep trench isolation (DTI) layer 180.

The deep trench 185 may be formed in a direction from a second surface 102 of a substrate 100 toward a first surface 101. The deep trench 185 may be exposed on the second surface 102 but not on the first surface 101. The deep trench 185 may have tapered or inclined side surfaces. Accordingly, a width of the deep trench 185 in the first direction X may be greater toward the second surface 102, but this is a non-limiting example.

The first DTI layer 180 may be in the deep trench 185. For example, the first DTI layer 180 may completely fill the deep trench 185.

Since the first DTI layer 180 may completely fill the deep trench 185, it may define a first pixel region P1. Specifically, the first DTI layer 180 may be on (e.g., may cover) edges (e.g., a perimeter) of the first pixel region P1. Accordingly, the first pixel region P1 may be defined inside the first DTI layer 180.

The first all layer 180 may be formed in a direction different from that of the above-described STI layer 140 and may be formed much deeper (although in a different direction) than the STI layer 140.

The first DTI layer 180 may be formed integrally with an insulating layer 150 (FIG. 7). That is, the insulating layer 150 disposed on the second surface 102 and the first DTI layer 180 may be formed by the same process. A material for forming the insulating layer 150 may be in (e.g., may fully fill) the deep trench 185 and may be formed on the second surface 102 of the substrate 100 to form the insulating layer 150. Accordingly, the insulating layer 150 and the first DTI layer 180 may include the same material. For example, the first DTI layer 180 may include the above-described low dielectric constant material.

In the image sensor according to some embodiments, the insulating layer 150 may also not be formed (i.e., may be omitted) or may be formed by a different process from that for the first DTI layer 180. In addition, the insulating layer 150 and the first DTI layer 180 may be made of different materials.

The first DTI layer 180 may serve as an antireflection layer. That is, the first DTI layer 180 may reduce the crosstalk between pixel regions by restricting components of incident light moving from the first pixel region P1 to other pixel regions. In addition, the first DTI layer 180, similarly to the insulating layer 150, may concentrate side-reflected components and side-refracted components of incident light onto a photoelectric device 120.

An image sensor according to embodiments will now be described with reference to FIG. 10. A description of elements and features identical to those previously described may be simplified or omitted.

Figure 10:
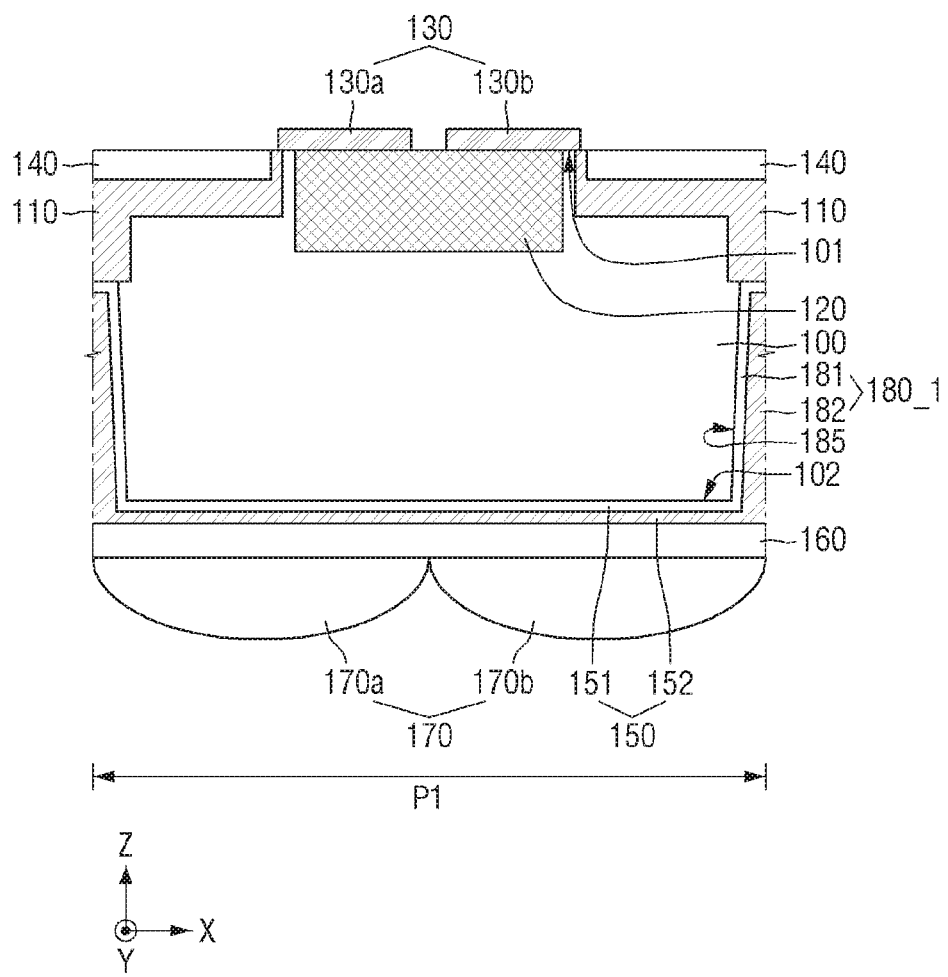
FIG. 10 is a cross-sectional view of an image sensor according to embodiments.

FIG. 10 is a cross-sectional view of an image sensor according to embodiments.

Referring to FIG. 10, the image sensor according to some embodiments may include a second DTI layer 180_1.

The second DTI layer 180_1 may include a first fixed charge layer 181 and a first antireflection layer 182. In addition, an insulating layer 150 may include a second fixed charge layer 151 and a second antireflection layer 152.

The first fixed charge layer 181 may be formed on surfaces (side and bottom surfaces) of a deep trench 185 in which the second DTI layer 180_1 is formed. The second fixed charge layer 151 may be formed on a second surface 102 of a substrate 100. The first fixed charge layer 181 and the second fixed charge layer 151 may be integrally formed by the same process. That is, the first fixed charge layer 181 and the second fixed charge layer 151 may be connected to each other and may be formed along the second surface 102 of the substrate 100 including the deep trench 185.

When a photoelectric device 120 formed in a first pixel region P1 has an N type, the first fixed charge layer 181 and the second fixed charge layer 151 may be formed to have a P$^+$ type. That is, the first fixed charge layer 181 and the second fixed charge layer 151 may reduce dark current by reducing electron-hole pairs thermally generated at the second surface 102 of the substrate 100. In some cases, the first fixed charge layer 181 and the second fixed charge layer 151 may be omitted.

The first fixed charge layer 181 and the second fixed charge layer 151 may include, for example, a metal oxide layer or a metal nitride layer, and the metal may be hafnium (HO, aluminum (Al), zirconium (Zr), tantalum (Ta), or titanium (Ti). In addition, the first fixed charge layer 181 and the second fixed charge layer 151 may include at least one of lanthanum (La), praseodymium Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), and yttrium (Y). Further, the first fixed charge layer 181 and the second fixed charge layer 151 may be made of a hafnium oxynitride layer or an aluminum oxynitride layer.

The first fixed charge layer 181 and the second fixed charge layer 151 may be deposited to a uniform thickness by atomic layer deposition (ALD). Accordingly, the first fixed charge layer 181 and the second fixed charge layer 151 may be formed conformally along the side and bottom surfaces of the deep trench 185 and the second surface 102 of the substrate 100.

Although each of the first fixed charge layer 181 and the second fixed charge layer 151 is illustrated as a single layer in the drawing, it may have a laminated structure of two or more layers made of the same or different materials. For example, each of the first fixed charge layer 181 and the second fixed charge layer 151 may have a double layer structure including a first metal oxide layer formed along the side and the bottom surfaces of the deep trench 185 and a second metal oxide layer formed on the first metal oxide layer. Here, the first metal oxide layer and the second metal oxide layer may include different metals. For example, the first metal oxide layer may include aluminum oxide (AlO), and the second metal oxide layer may include tantalum oxide (TaO).

The first antireflection layer 182 and the second antireflection layer 152 may be formed on the first fixed charge layer 181 and the second fixed charge layer 151, respectively. The first antireflection layer 182 may be in (e.g., may fill) the deep trench 185. The second antireflection layer 152 may be formed on the second surface 102 of the substrate 100 along a surface of the second fixed charge layer 151.

The first antireflection layer 182 and the second antireflection layer 152 prevent/inhibit reflection of light incident from outside of the image sensor. The first antireflection layer 182 and the second antireflection layer 152 may include a material having a refractive index different from that of the material of the first fixed charge layer 181 and the second fixed charge layer 151. For example, the first antireflection layer 182 and the second antireflection layer 152 may be made of an insulating layer such as a silicon oxide layer, a silicon nitride layer, a silicon oxynitride layer, a resin, a combination of these materials, or a laminate of these materials.

The double layer structure consisting of the first fixed charge layer 181 and the second fixed charge layer 151 and the first antireflection layer 182 and the second antireflection layer 152 may perform an antireflection function due to the different refractive indices. Thus, it is possible to prevent/inhibit reflection of light incident on the second surface 102 of the substrate 100.

The first antireflection layer 182 and the second antireflection layer 152 may have a different material/thickness depending on the wavelength of light used in a photo process. For example, the first antireflection layer 182 and the second antireflection layer 152 may be formed by laminating a silicon oxide layer having a thickness of about 50 to 200 Angstroms (Å) and a silicon nitride layer having a thickness of about 300 to 500 Å.

An image sensor according to embodiments will now be described with reference to FIG. 11. A description of elements and features identical to those previously described may be simplified or omitted.

Figure 11:
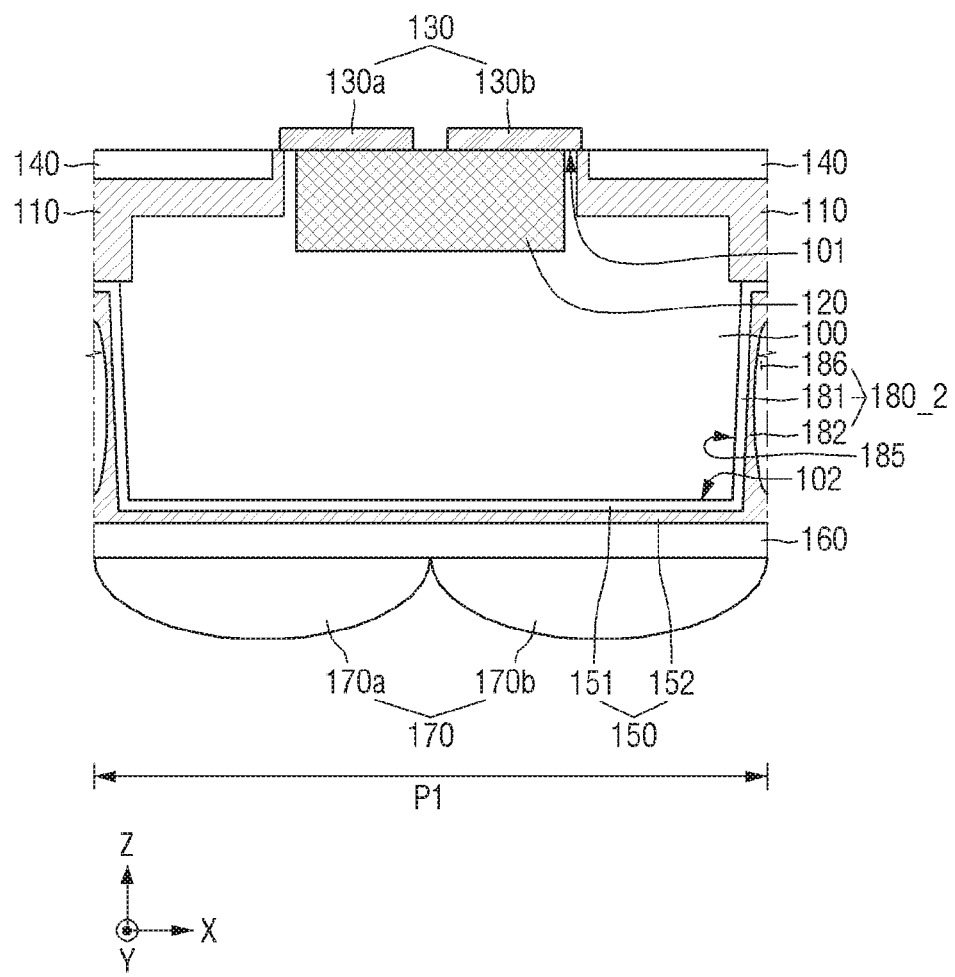
FIG. 11 is a cross-sectional view of an image sensor according to embodiments.

FIG. 11 is a cross-sectional view of an image sensor according to embodiments.

Referring to FIG. 11, a third DTI layer 180_2 of the image sensor according to some embodiments may include a void 186.

The void 186 may be formed inside a first antireflection layer 182. The formation of the void 186 may be determined by the gap-filling ability of the material that forms the first antireflection layer 182.

That is, since a deep trench 185 is narrow, the void 186 may be formed when the first antireflection layer 182 fails to completely fill the deep trench 185. Therefore, if the deep trench 185 is sufficiently wide or the gap-filling ability of the material that forms the first antireflection layer 182 is sufficiently good, the void 186 may not be formed.

Since the void 186 includes air that has a lowest dielectric constant, it may rather reinforce the low dielectric constant characteristic of the first antireflection layer 182. Accordingly, the image sensor according to some embodiments can have a higher antireflective effect and higher quantum efficiency.

An image sensor according to embodiments will now be described with reference to FIGS. 12 and 13. A description of elements and features identical to those previously described may be simplified or omitted.

Figure 12:
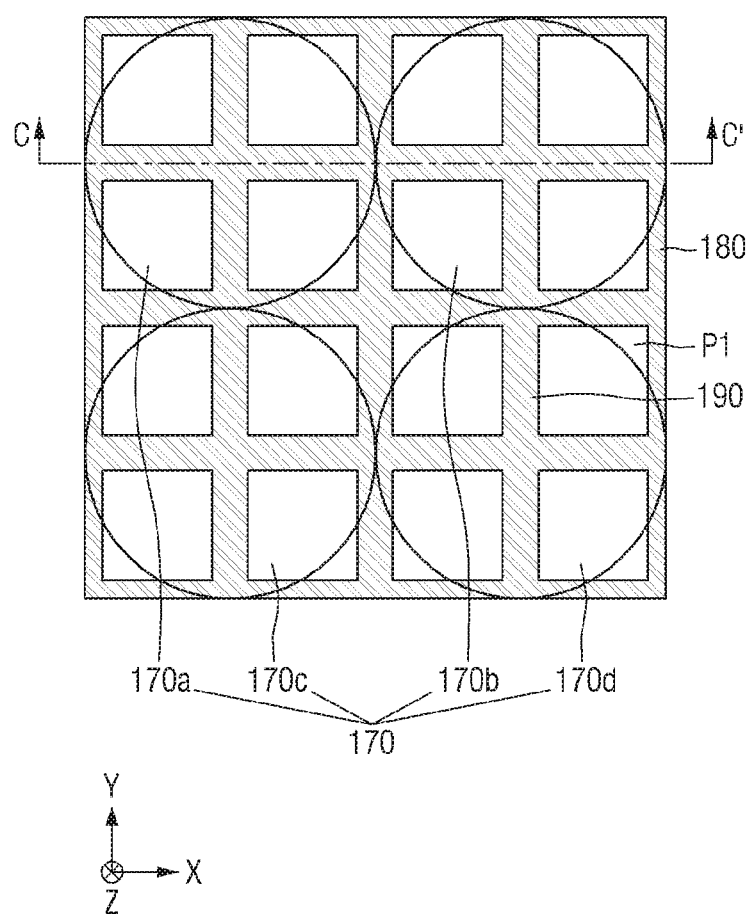
FIG. 12 is a bottom view of an image sensor according to embodiments.
Figure 13:
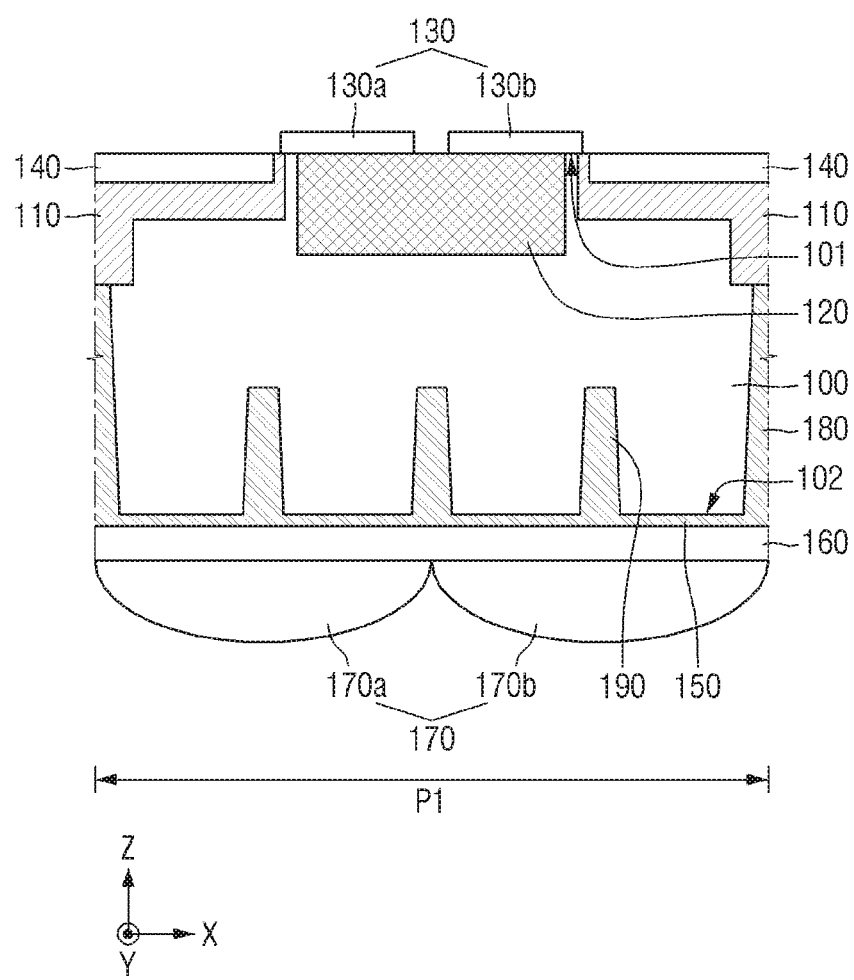
FIG. 13 is a cross-sectional view taken along the line C-C' of FIG. 12.

FIG. 12 is a bottom view of an image sensor according to embodiments, and FIG. 13 is a cross-sectional view taken along the line C-C' of FIG. 12.

Referring to FIGS. 12 and 13, the image sensor according to some embodiments includes a scattering structure, such as a center layer 190.

The center DTI layer 190 may be located inside a first pixel region P1. The center DTI layer 190 may be similar in form to a first DTI layer 180.

The center DTI layer 190 may have, but does not necessarily have, tapered side surfaces. The center DTI layer 190 may be connected to the first DTI layer 180 by an insulating layer 150. Accordingly, the center DTI layer 190, the first DTI layer 180, and/or the insulating layer 150 may comprise respective portions of the same layer. That is, the center art layer 190, the first DTI layer 180, and the insulating layer 150 may be integrally formed by the same process, but this is a non-limiting example.

The center DTI layer 190 may include the same material as the insulating layer 150 and the first DTI layer 180. That is, the center DTI layer 190 may include the above-described low dielectric constant material.

The center DTI layer 190 may be shallower than the first DTI layer 180. This may be due to a difference between the function of the first DTI layer ISO for separating the first pixel region P1 from other pixel regions and the function of the center DTI layer 190 for scattering incident light.

In other words, incident light may be scattered by the center DTI layer 190. That is, since a plurality of microlenses are formed in one pixel region in the image sensor according to some embodiments, light may be focused not on one point but on a plurality of points. In this case, incident light may rather be scattered to shorten an effective penetration depth of the incident light, thereby increasing the light concentration efficiency.

As illustrated in FIG. 12, the center DTI layer 190 and the first layer 180 may also be in contact with each other in a horizontal direction to form a cross shape. Since this shape can be formed by forming the first DTI layer 180 and the center DTI layer 190 using similar patterning processes, process costs can be reduced.

An image sensor according to embodiments will now be described with reference to FIG. 14. A description of elements and features identical to those previously described may be simplified or omitted.

Figure 14:
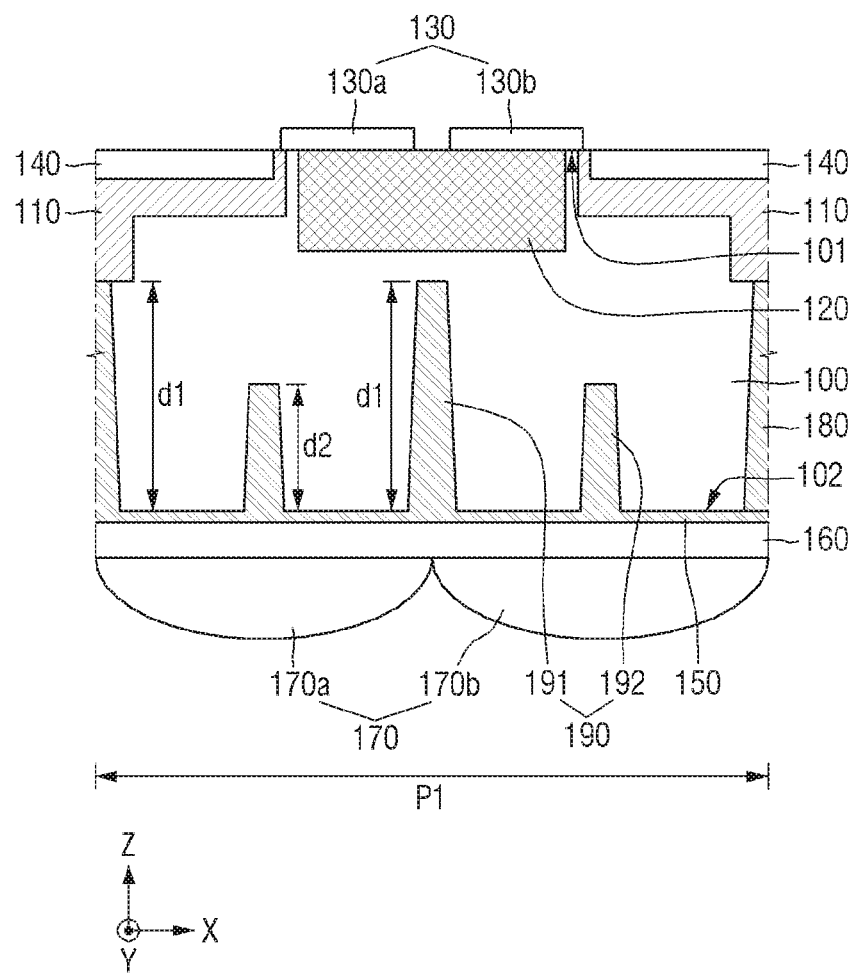
FIG. 14 is a cross-sectional view of an image sensor according to embodiments.

FIG. 14 is a cross-sectional view of an image sensor according to embodiments.

Referring to FIG. 14, a center DTI layer 190 of the image sensor according to some embodiments may include a first center DTI layer 191 and a second center DTI layer 192.

The first center DTI layer 191 may have the same first depth d1. (from a second surface 102 of a substrate 100) as a first DTI layer 180. The second center DTI layer 192 may have a second depth d2 (from the second surface 102) smaller than the first depth d1.

The first center DTI layer 191 is located at a boundary between microlenses 170 to prevent/inhibit side leakage, so that incident light can be concentrated by each microlens 170.

The second center DTI layer 192 may function to scatter light incident on/by each microlens 170, Accordingly, the quantum efficiency of the image sensor according to some embodiments may increase dramatically.

In addition, since the first center DTI layer 191 has the same depth as the first DTI layer 180 it can be formed at the same time as the first DTI layer 180. Therefore, an increase in process cost may not be large.

An image sensor according to embodiments will now be described with reference to FIG. 15. A description of elements and features identical to those previously described may be simplified or omitted.

Figure 15:
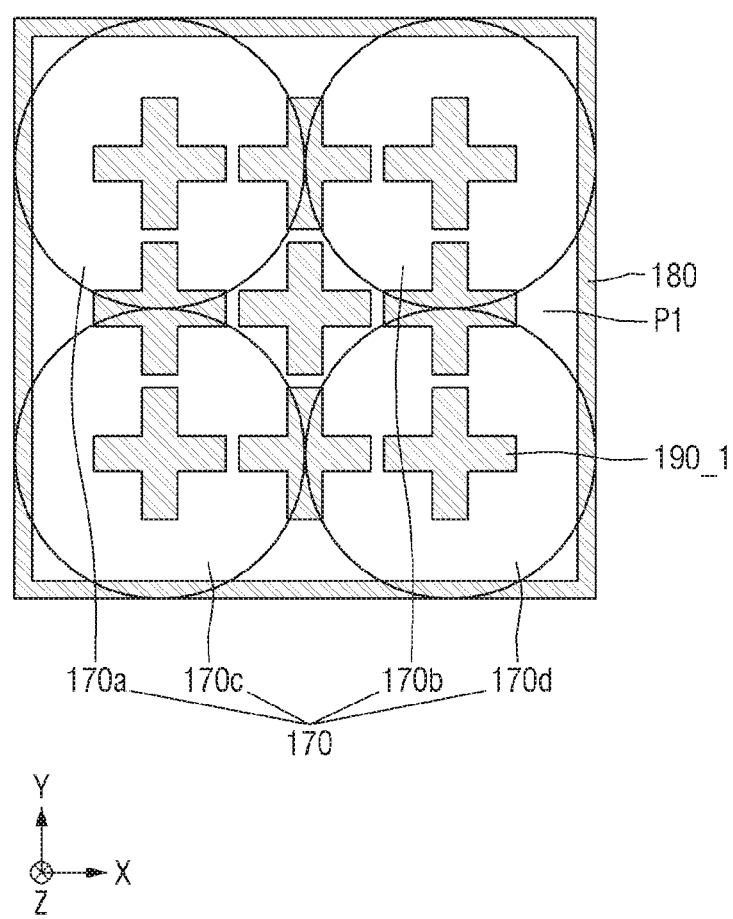
FIG. 15 is a bottom view of an image sensor according to embodiments.

FIG. 15 is a bottom view of an image sensor according to embodiments.

Referring to FIG. 15, a center DTI layer 190_1 of the image sensor according to some embodiments may be separated from a first DTI layer 180 in a horizontal plane.

Since the center DTI layer 190_1 is separated from the first DTI layer 180 in the horizontal plane, the area of a second surface 102 of a substrate 100 through which incident light is transmitted may be relatively large. Accordingly, the absorption efficiency of incident light scattered by the center DTI layer 190_1 can be further improved.

In addition, since the center DTI layer 190_1 is cross-shaped, the process of forming the center DTI layer 190_1 may not be difficult. Furthermore, since a plurality of center DTI layers 190_1 are aligned in rows and columns, scattered incident light can be uniformly incident on a first pixel region P1.

An image sensor according to embodiments will now be described with reference to FIG. 16. A description of elements and features identical to those previously described may be simplified or omitted.

Figure 16:
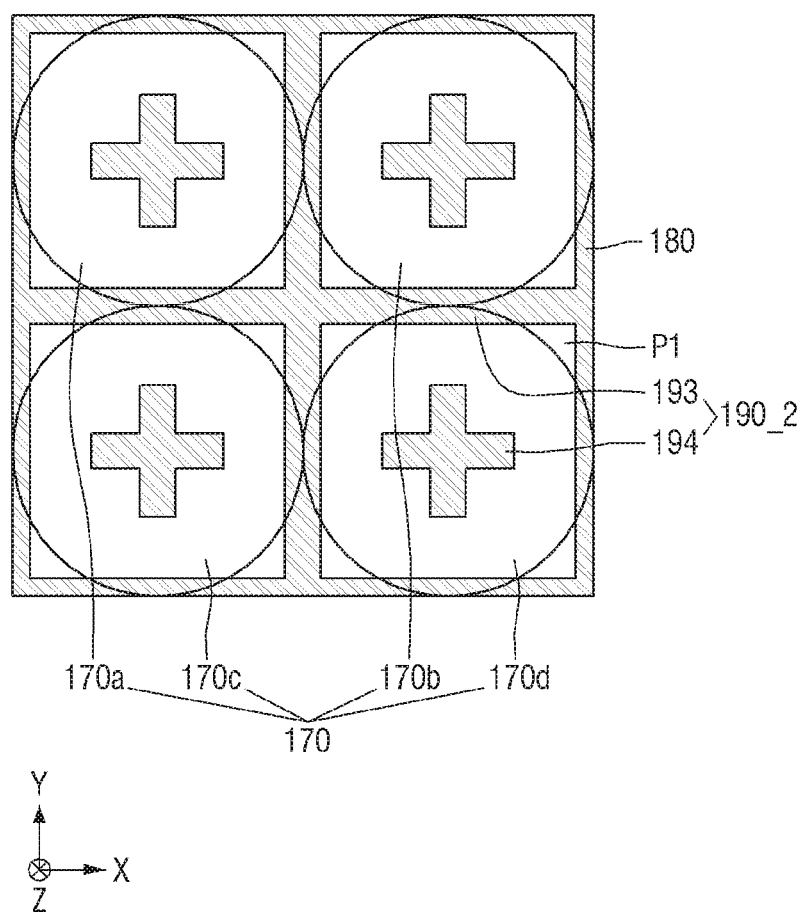
FIG. 16 is a bottom view of an image sensor according to embodiments.

FIG. 16 is a bottom view of an image sensor according to embodiments.

Referring to FIG. 16, a center DTI layer 190 of the image sensor according to some embodiments may include a lattice DTI layer 193 and a cross DTI layer 194.

The lattice DTI layer 193 may form a lattice shape in a horizontal plane together with a first STI layer 180. The lattice DTI layer 193 may be in contact with the first DTI layer 180 in the horizontal plane. Accordingly, a first pixel region P1 may be divided into a plurality of regions respectively corresponding to microlenses 170. Thus, incident light can be focused more efficiently.

The cross DTI layer 194 may be cross-shaped and may be disposed at a center of each of the regions into which the first pixel region P1 is divided by the lattice DTI layer 193. The cross DTI layer 194 may scatter light incident on/by each microlens 170, thereby increasing the quantum efficiency of the image sensor according to some embodiments.

Since the cross art layer 194 is separated from the first DTI layer 180 and the lattice DTI layer 193 in the horizontal plane, the area of a second surface 102 of a substrate 100 through which incident light is transmitted may be relatively large. Accordingly, the absorption efficiency of scattered incident light can be further improved.

In addition, since the lattice DTI layer 193 and the cross DTI layer 194 are formed in a lattice shape and a cross shape, respectively, the process of forming the lattice DTI layer 193 and the cross DTI layer 194 may not be difficult. Furthermore, since the lattice DTI layer 193 and the cross art layer 194 are aligned (e.g., symmetrically arranged), scattered incident light can be uniformly incident on the first pixel region P1.

An image sensor according to embodiments will now be described with reference to FIGS. 17 and 18. A description of elements and features identical to those previously described may be simplified or omitted.

Figure 17:
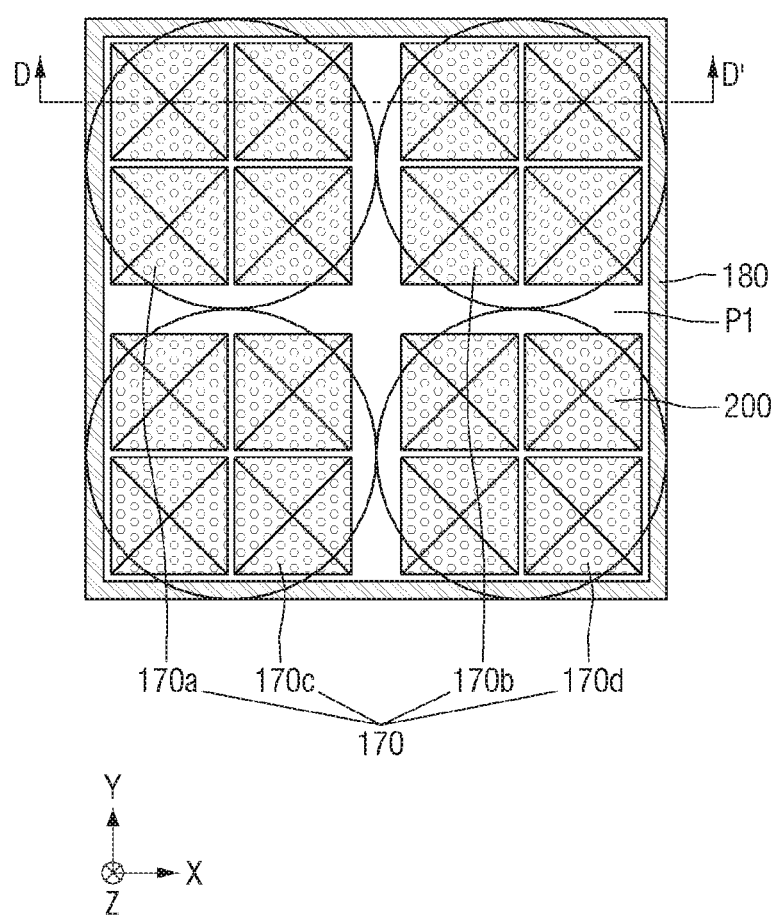
FIG. 17 is a bottom view of an image sensor according to embodiments.
Figure 18:
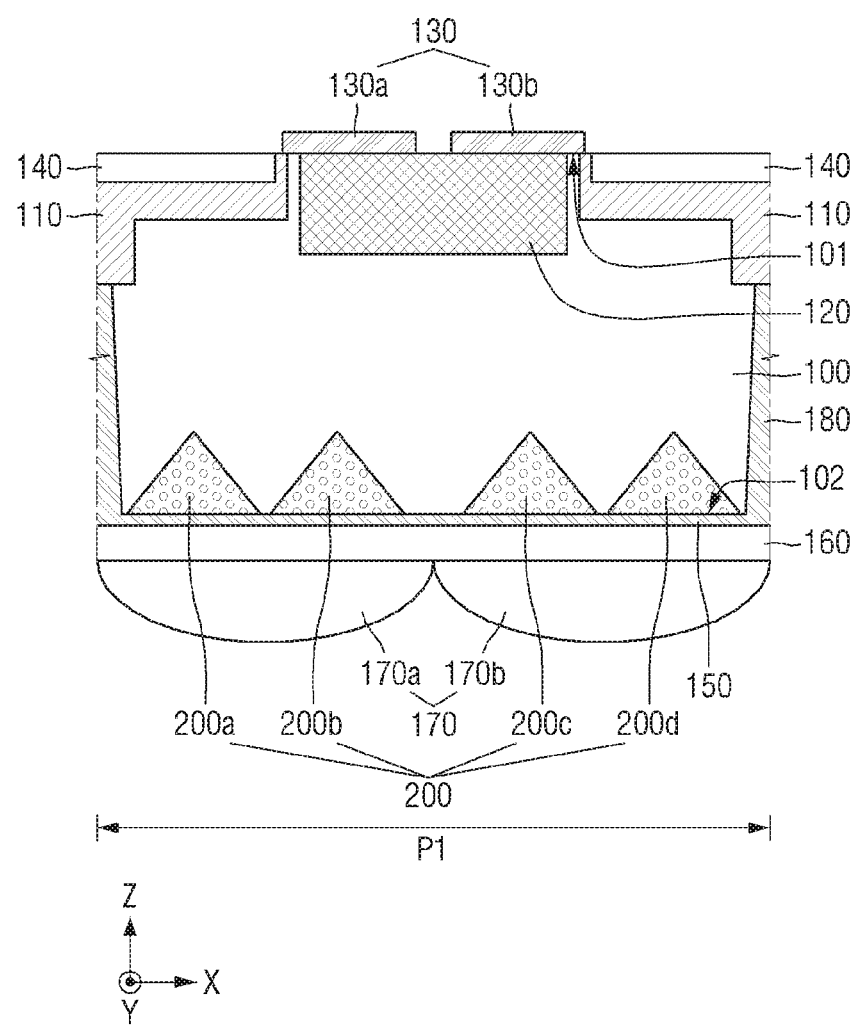
FIG. 18 is a cross-sectional view taken along the line D-D' of FIG. 17.

FIG. 17 is a bottom view of an image sensor according to embodiments, and FIG. 18 is a cross-sectional view taken along the line D-D' of FIG. 17.

Referring to FIGS. 17 and 18, the image sensor according to some embodiments may include a pyramid structure 200.

The pyramid structure 200 may be formed in a direction from a second surface 102 of a substrate 100 toward a first surface 101. The pyramid structure 200 may have the same upper surface as the second surface 102 and may have a pointed shape toward the first surface 101.

The pyramid structure 200 may scatter light incident on/by a microlens 170. Accordingly, the quantum efficiency of the image sensor according to some embodiments can be increased by the scattered incident light.

The pyramid structure 200 may be provided in plural numbers. Specifically, the pyramid structures 200 may include a first pyramid structure 200a, a second pyramid structure 200b, a third pyramid structure 200c, and a fourth pyramid structure 200d. However, the number of the pyramid structures 200 is not fixed to four, but may vary. In FIG. 18, it is assumed for ease of description that the number of the pyramid structures 200 is four.

The first pyramid structure 200a and the second pyramid structure 200b may vertically overlap a first microlens 170a, Similarly, the third pyramid structure 200c and the fourth pyramid structure 200d may vertically overlap a second microlens 170b.

That is, the first pyramid structure 200a and the second pyramid structure 200b may scatter light incident on/by the first microlens 170a, and the third pyramid structure 200c and the fourth pyramid structure 200d may scatter light incident on/by the second microlens 170b.

Since the pyramid structures 200 have a smaller depth than a trench structure, the process of forming the pyramid structures 200 may be low in difficulty. In addition, due to their shape, the pyramid structures 200 may have higher scattering efficiency than other structures.

An image sensor according to embodiments will now be described with reference to FIG. 19. A description of elements and features identical to those previously described may be simplified or omitted.

Figure 19:
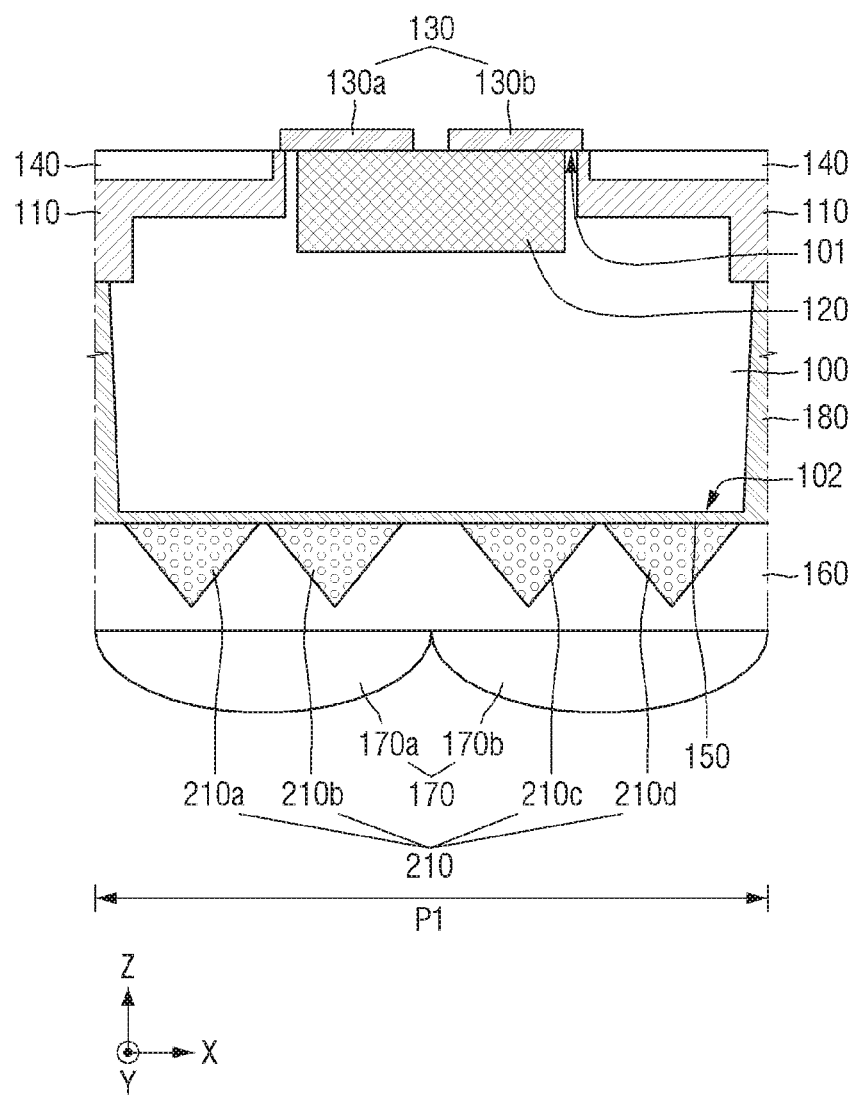
FIG. 19 is a cross-sectional view of an image sensor according to embodiments.

FIG. 19 is a cross-sectional view of an image sensor according to embodiments.

Referring to FIG. 19, the image sensor according to some embodiments includes an inverted pyramid structure 210.

The inverted pyramid structure 210 may be formed to protrude from a second surface 102 of a substrate 100. The inverted pyramid structure 210 may be formed on an insulating layer 150. The inverted pyramid structure 210 may have the same lower surface as the second surface 102, and a protruding portion of the inverted pyramid structure 210 may have a pointed shape.

A planarizing layer 160 may be formed on the inverted pyramid structure 210. For example, the planarizing layer 160 may cover the whole of the inverted pyramid structure 210 to provide a flat upper surface. Microlenses 170 may be disposed on the flat upper surface.

The inverted pyramid structure 210 may include a material having a different dielectric constant from that of the substrate 100. Thus, the inverted pyramid structure 210 may scatter light incident on/by the microlenses 170. Accordingly, the quantum efficiency of the image sensor according to some embodiments can be increased by the scattered incident light.

The inverted pyramid structure 210 may be provided in plural numbers. Specifically, the inverted pyramid structures 210 may include a first inverted pyramid structure 210a, a second inverted pyramid structure 210b, a third inverted pyramid structure 210c, and a fourth inverted pyramid structure 210d. However, the number of the inverted pyramid structures 210 is not fixed to four, but may vary. In FIG. 19, it is assumed for ease of description that the number of the inverted pyramid structures 210 is four.

The first inverted pyramid structure 210a and the second inverted pyramid structure 210b may vertically overlap a first microlens 170a. Similarly, the third inverted pyramid structure 210c and the fourth inverted pyramid structure 210d may vertically overlap a second microlens 170b.

That is, the first inverted pyramid structure 210a and the second inverted pyramid structure 210h may scatter light incident on/by the first microlens 170a, and the third inverted pyramid structure 210c and the fourth inverted pyramid structure 210d may scatter light incident on/by the second microlens 170b.

Since the inverted pyramid structures 210 are formed on the second surface 102, it is unnecessary to etch the substrate 100 and possible to secure an effective transmission length. Therefore, the quantum efficiency of the image sensor can be increased. In addition, since the pointed portion of each of the inverted pyramid structures 210 is formed to face incident light, the scattering efficiency can be further increased.

An image sensor according to embodiments will now be described with reference to FIG. 20. A description of elements and features identical to those previously described may be simplified or omitted.

Figure 20:
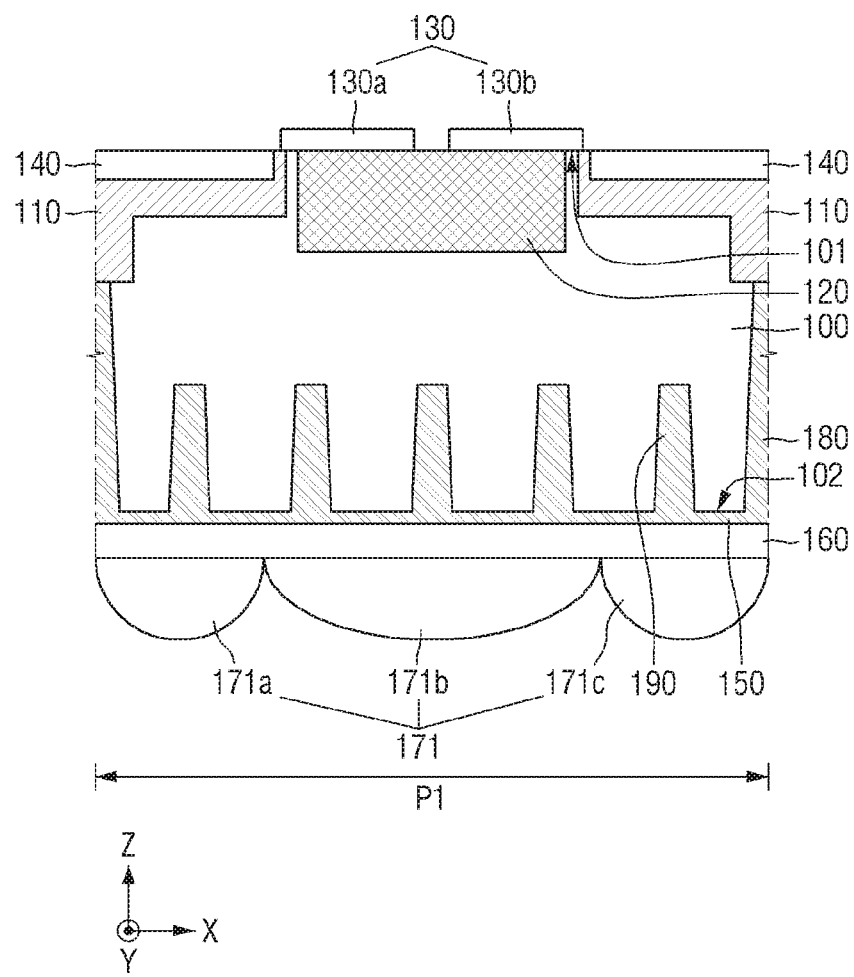
FIG. 20 is a cross-sectional view of an image sensor according to embodiments.

FIG. 20 is a cross-sectional view of an image sensor according to embodiments.

Referring to FIG. 20, the image sensor according to some embodiments may include microlenses 171.

The microlenses 171 may include a first microlens 171a, a second microlens 171b, and a third microlens 171c.

The first microlens 171a and the third microlens 171c may be the same size. On the other hand, the second microlens 171b may be larger than the first microlens 171a and the third microlens 171c. Specifically, the horizontal area of the second microlens 171b may be larger than those of the first microlens 171a and the third microlens 171c.

The second microlens 171b may be disposed closer to a center of a first pixel region P1 than the first microlens 171a and the third microlens 171c. Accordingly, light concentration in a central portion of the image sensor according to some embodiments may be reinforced by the relatively large second microlens 170b.

Since light concentration in the central portion on which the largest amount of light is incident is reinforced, the quantum efficiency of the image sensor according to some embodiments can be further improved.

An image sensor according to embodiments will now be described with reference to FIG. 21. A description of elements and features identical to those previously described may be simplified or omitted.

Figure 21:
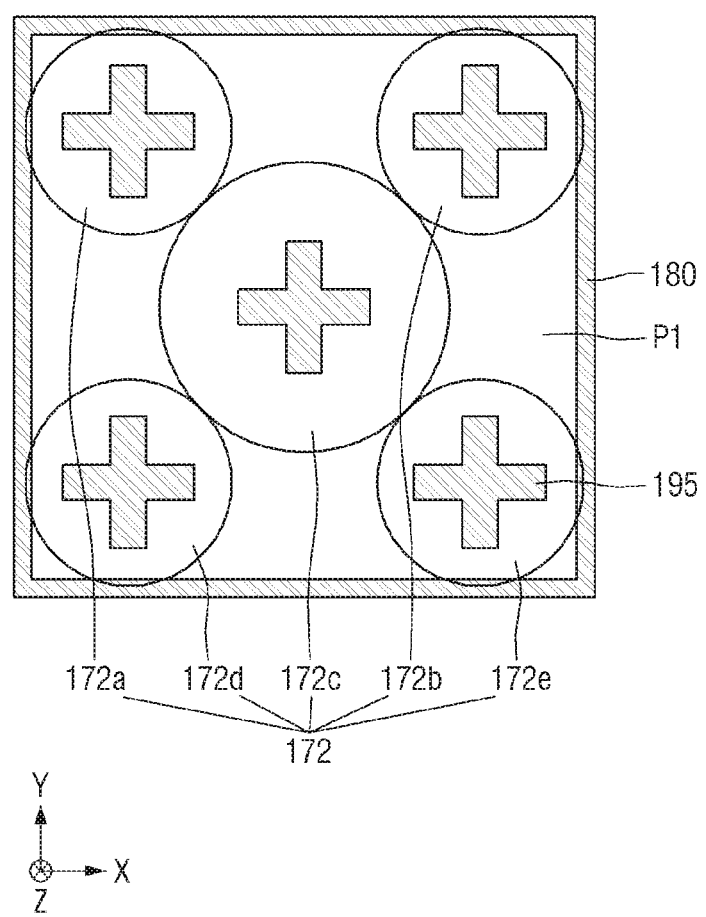
FIG. 21 is a bottom view of an image sensor according to embodiments.

FIG. 21 is a bottom view of an image sensor according to embodiments.

Referring to FIG. 21, the image sensor according to some embodiments may include third center DTI layers 195 and microlenses 172.

The third center DTI layers 195 may be cross-shaped and may be disposed adjacent to four vertices and a center of a first pixel region P1, respectively. Although five third center DTI layers 195 are illustrated in the drawing, since the number of the third center DTI layers 195 are determined by corresponding (e.g., one-to-one correspondence) to the locations of the microlenses 172, the number of the microlenses 172 may vary according to the number of the microlenses 172.

The microlenses 172 may include a first microlens 172a, a second microlens 172b, a third microlens 172c, a fourth microlens 172d, and a fifth microlens 172e. The first microlens 172a, the second microlens 172b, the fourth microlens 172d, and the fifth microlens 172e may be the same size. On the other hand, the third microlens 172c may be larger than the first microlens 172a, the second microlens 172b, the fourth microlens 172d, and the fifth microlens 172e.

The first microlens 172a, the second microlens 172b, the fourth microlens 172d and the fifth microlens 172e may overlap the third center DTI layers 195 disposed adjacent to the vertices of the first pixel region P1 to facilitate scattering of incident light. The third microlens 172c may overlap the third center DTI layer 195 located at the center of the first pixel region P1 to facilitate scattering of incident light.

Since the third microlens 172c located at the center is the largest in this non-limiting example, light concentration in the central portion can be reinforced, thereby increasing quantum efficiency.

An image sensor according to embodiments will now be described with reference to FIG. 22, A description of elements and features identical to those previously described may be simplified or omitted.

Figure 22:
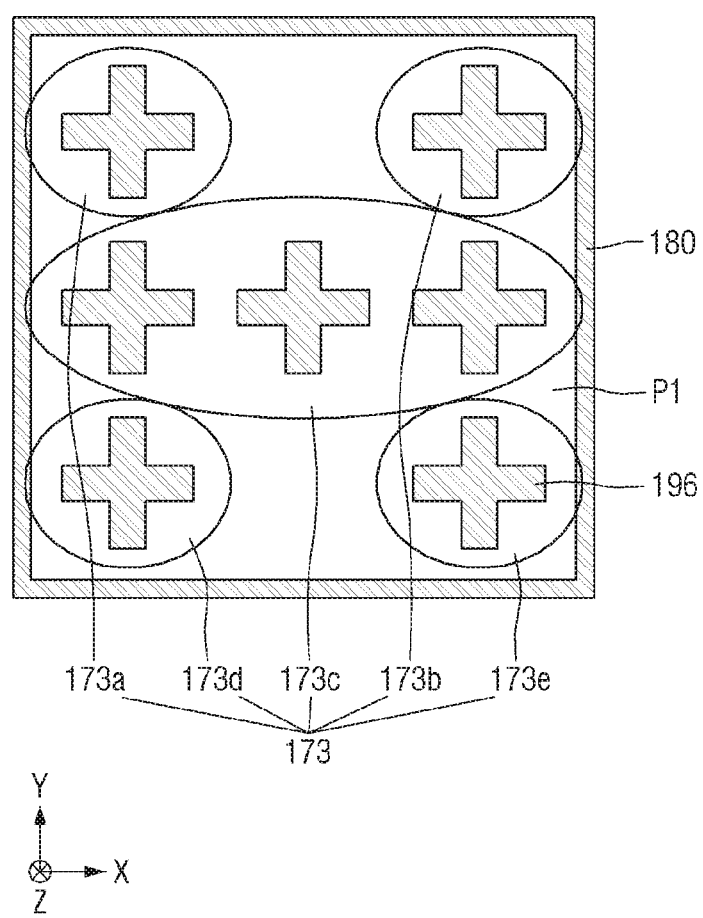
FIG. 22 is a bottom view of an image sensor according to embodiments.

FIG. 22 is a bottom view of an image sensor according to embodiments.

Referring to FIG. 22, the image sensor according to some embodiments may include fourth center DTI layers 196 and microlenses 173.

The fourth center DTI layers 196 may be cross-shaped and may be disposed adjacent to four vertices of a first pixel region P1. In addition, the fourth center DTI layers 196 may form a row in the first direction X to pass through a center of the first pixel region P1. Although seven fourth center DTI layers 196 are illustrated in the drawing, the number of the fourth center DTI layers 196 may vary.

The microlenses 173 may include a first microlens 173a, a second microlens 173b, a fourth microlens 173d, a fifth microlens 173e, and a third microlens 173c. The first microlens 173a, the second microlens 173b, the fourth microlens 173d, and the fifth microlens 173e may have the same size. On the other hand, the third microlens 173c may be larger than the first microlens 173a, the second microlens 173b, the fourth microlens 173d, and the fifth microlens 173e. Specifically, the third microlens 173c may extend in the first direction X to be on (e.g., to cover) multiple/all sides of the first pixel region P1 in the first direction X.

The first microlens 173a, the second microlens 173b, the fourth microlens 173d and the fifth microlens 173e may overlap the fourth center DTI layers 196 adjacent to the vertices of the first pixel region P1 to facilitate scattering of incident light. The third microlens 173c may overlap three fourth center DTI layers 196 located at the center of the first pixel region P1 to facilitate scattering of incident light.

Since the third microlens 173c located at the center extends in the first direction X in this non-limiting example, an area where incident light is concentrated is broadened from the central portion to a portion extending from the center to each side of the first pixel region P1. This may result in very high quantum efficiency.

An image sensor according to embodiments will now be described with reference to FIG. 23. A description of elements and features identical to those previously described may be simplified or omitted.

Figure 23:
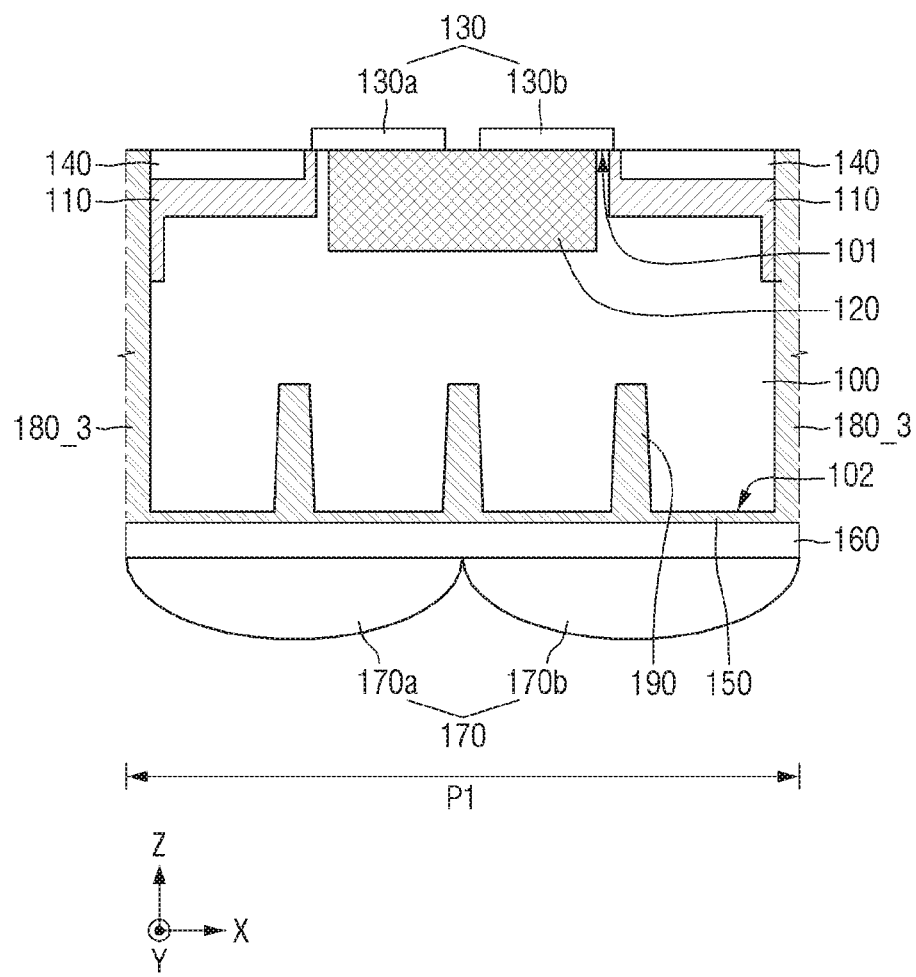
FIG. 23 is a cross-sectional view of an image sensor according to embodiments.

FIG. 23 is a cross-sectional view of an image sensor according to embodiments.

Referring to FIG. 23, the image sensor according to some embodiments may include a fourth DTI layer 180_3.

The fourth DTI layer 180_3 may pass through a substrate 100 to be exposed on both a first surface 101 and a second surface 102 of the substrate 100, For example, the fourth DTI layer 180_3 may extend continuously in the third direction Z from a level of (e.g., coplanar with) the first surface 101 to a level of (e.g., coplanar with) the second surface 102. Accordingly, the fourth DTI layer 180_3 may contact an STI layer 140, but this is a non-limiting example.

The fourth DTI layer 180_3 may be a full DTI layer and completely block the crosstalk between a first pixel region P1 and other pixel regions. Accordingly, this minimizes/reduces the interference between pixel regions, thereby increasing the reliability of the output of the image sensor.

An image sensor according to embodiments will now be described with reference to FIG. 24. A description of elements and features identical to those previously described may be simplified or omitted.

Figure 24:
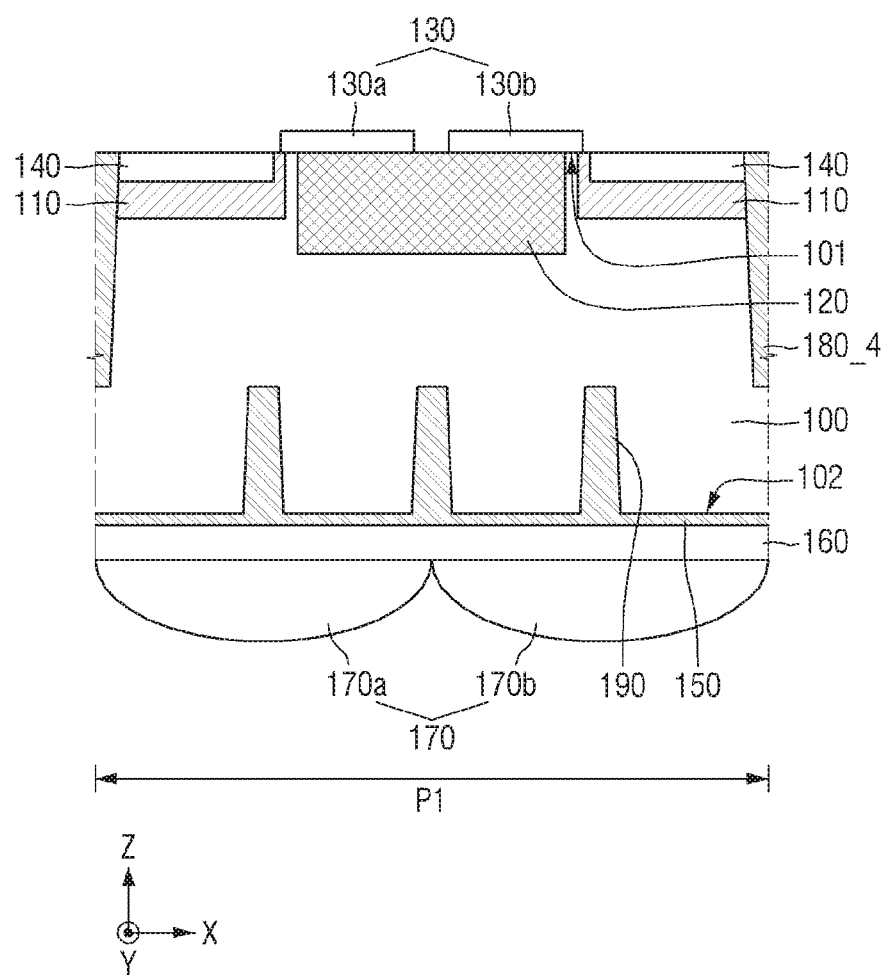
FIG. 24 is a cross-sectional view of an image sensor according to embodiments.

FIG. 24 is a cross-sectional view of an image sensor according to embodiments.

Referring to FIG. 24, the image sensor according to some embodiments may include a fifth DTI layer 180_4.

The fifth DTI layer 180_4 may be formed in a direction from a first surface 101 toward a second surface 102 of a substrate 100 and may not be exposed on the second surface 102. Accordingly, the fifth DTI layer 180_4 may contact an STI layer 140, but this is a non-limiting example.

The fifth DTI layer 180_4 may have tapered or inclined side surfaces. Accordingly, a width of the fifth DTI layer 180_4 in the first direction X may be greater toward the first surface 101, but this is a non-limiting example.

The fifth DTI layer 180_4 may be a front side DTI layer and may reinforce the isolation of elements formed on the first surface 101. Accordingly, the accuracy of operation of the elements formed on the first surface 101 may increase, thereby increasing the reliability of the output of the image sensor.

An image sensor according to embodiments will now be described with reference to FIG. 25. A description of elements and features identical to those previously described may be simplified or omitted.

Figure 25:
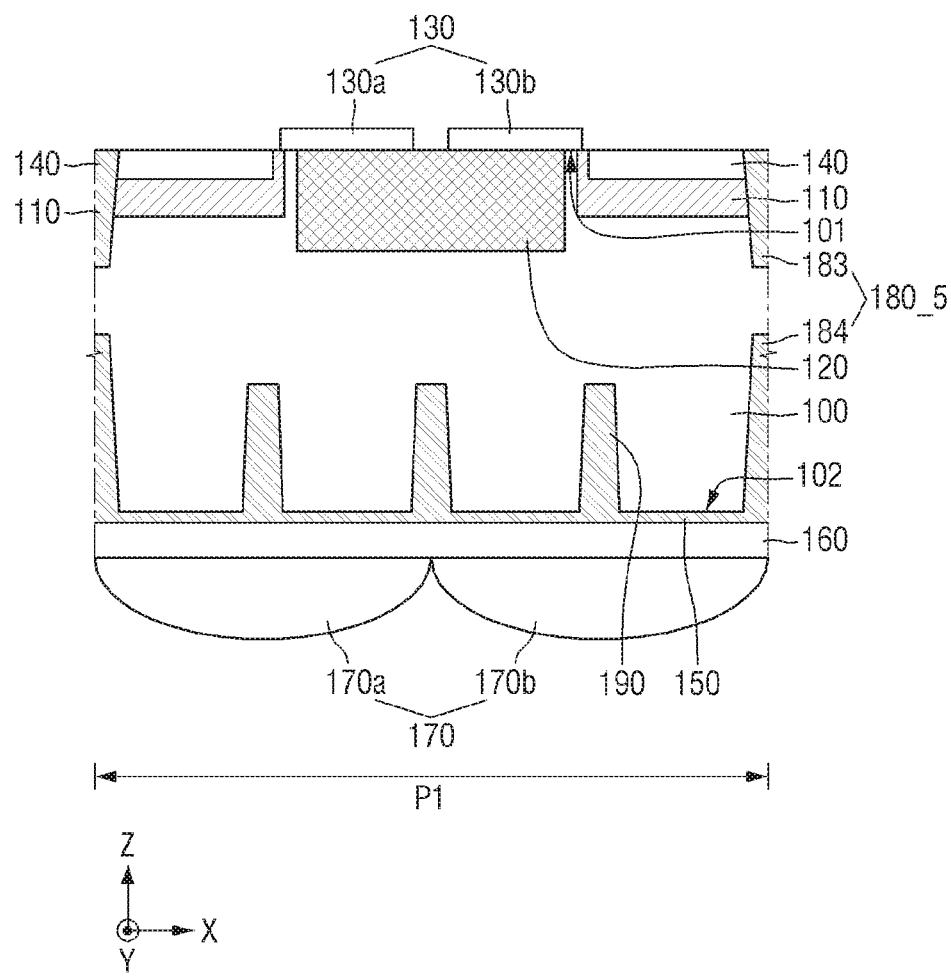
FIG. 25 is a cross-sectional view of an image sensor according to embodiments.

FIG. 25 is a cross-sectional view of an image sensor according to embodiments.

Referring to FIG. 25, the image sensor according to some embodiments may include a sixth DTI layer 180_5.

The sixth DT layer 180_5 may include a front side DTI layer 183 and a back side DTI layer 184.

The front side DTI layer 183 is formed in a direction from a first surface 101 toward a second surface 102 and may not be exposed on the second surface 102. Accordingly, a width of the front side DTI layer 183 in the first direction X may be greater toward the first surface 101, but this is a non-limiting example.

The back side DTI layer 184 is formed in a direction from the second surface 102 toward the first surface 101 and may not be exposed on the first surface 101. Accordingly, a width of the backside DTI layer 184 in the first direction X may be greater toward the second surface 102, but this is a non-limiting example.

Since the sixth DTI layer 180_5 has both the front side DTI layer 183 and the back side DTI layer 184, it can reinforce the isolation of elements formed on the first surface 101 and reduce the crosstalk between a first pixel region P1 and other regions.

Some embodiments of the present disclosure have been described with reference to the attached drawings, but it will be understood by one of ordinary skill in the art that various changes in form and details may be made therein without departing from the scope defined by the following claims. Further, the above-described embodiments are merely examples and do not limit the scope.

What is claimed is:

1. An image sensor, comprising:
   a substrate comprising a pixel region, a first surface, and a second surface that is opposite the first surface;
   first and second photogates that are on the first surface and are configured to generate electric charge responsive to incident light in the pixel region;
   first and second microlenses that share a pixel comprising the pixel region, are on the second surface, and are configured to pass the incident light toward the first and second photogates;
   a trench isolation layer;
   a scattering structure that is on the second surface in the pixel region and is configured to scatter the incident light, wherein the image sensor comprises a three-dimensional image sensor;
   wherein the scattering structure comprises a center trench isolation layer that extends in the pixel region from the second surface toward the first surface; and
   wherein the center trench isolation layer and the trench isolation layer comprise first and second portions, respectively, of a same continuous layer.

2. The image sensor of claim 1,
   wherein the trench isolation layer is at edges of the pixel region to define the pixel region, and
   wherein the trench isolation layer does not extend between the first and second photogates.

3. The image sensor of claim 1
   wherein the center trench isolation layer comprises first and second center trench isolation layers, and
   wherein a first depth of the first center trench isolation layer from the second surface toward the first surface is deeper than a second depth of the second center trench isolation layer from the second surface toward the first surface.

4. The image sensor of claim 1 wherein the scattering structure comprises a pyramid structure.

5. The image sensor of claim 4, wherein the pyramid structure protrudes from the second surface.

6. The image sensor of claim 1 wherein a dielectric constant of the scattering structure is different from that of the substrate.

7. An image sensor, comprising:
   a substrate comprising a pixel region, a first surface, and a second surface that is opposite the first surface;
   first and second photogates on the first surface and configured to generate electric charge responsive to incident light in the pixel region;
   a trench isolation layer that defines the pixel region and does not extend between the first and second photogates;
   first and second scattering structures that are on the second surface in the pixel region and are configured to scatter the incident light in the pixel region; and
   first and second lenses that share a pixel comprising the pixel region, are on the second surface and configured to pass the incident light into the pixel region,
   wherein the first scattering structure and the first lens vertically overlap each other, and the second scattering structure and the second lens vertically overlap each other;
   wherein the image sensor comprises a three-dimensional image sensor;
   wherein the first and second scattering structures comprises a center trench isolation layer that extends in the pixel region from the second surface toward the first surface; and
   wherein the center trench isolation layer and the trench isolation layer comprise first and second portions, respectively, of a same continuous layer.

8. The image sensor of claim 7,
   wherein the first and second lenses comprise first and second microlenses, respectively, and
   wherein the first microlens is larger than the second microlens.

9. The image sensor of claim 8, wherein the first microlens is closer than the second microlens to a center of the pixel region.

10. The image sensor of claim 7,
    wherein the first and second lenses comprise first and second microlenses, respectively, and
    wherein the first and second microlenses are the same size.

11. The image sensor of claim 7, further comprising a third lens on the second surface and configured to pass the incident light into the pixel region, wherein the first lens is between the second and third lenses.

12. An image sensor, comprising:
    a substrate comprising a pixel region, a first surface, and a second surface that is opposite the first surface;
    first and second photogates on the first surface and configured to generate electric charge responsive to incident light in the pixel region;
    a shallow trench isolation (STI) layer that extends a first distance in a direction from the first surface toward the second surface in the pixel region;
    a deep trench isolation (DTI) layer that defines the pixel region and extends a second distance in the direction, wherein the second distance is longer than the first distance;
    first and second lenses that share a pixel comprising the pixel region, are on the second surface and configured to pass the incident light into the pixel region;
    a photoelectric device that is between the first and second photogates and the first and second lenses,
    wherein the first lens extends across a first portion of the photoelectric device, and
    wherein the second lens extends across a second portion of the photoelectric device;

a scattering structure that is on the second surface in the pixel region and is configured to scatter the incident light, wherein the image sensor comprises a three-dimensional image sensor;

wherein the scattering structure comprises a center trench isolation layer that extends in the pixel region from the second surface toward the first surface; and wherein the center trench isolation layer and the trench isolation layer comprise first and second portions, respectively, of a same continuous layer.

13. The image sensor of claim 12, wherein the DTI layer extends continuously from a level of the first surface to a level of the second surface.

14. The image sensor of claim 12, wherein the DTI layer comprises a front side DTI layer extending from a level of the first surface toward a level of the second surface and is separated from the level of the second surface.

15. The image sensor of claim 14, wherein the DTI layer comprises a back side DTI layer extending from the level of the second surface toward the level of the first surface, wherein the front side DTI layer and the back side DTI layer are separated from each other.

16. The image sensor of claim 12, wherein the DTI layer comprises a back side DTI layer extending from a level of the second surface toward a level of the first surface and is separated from the level of the first surface.

17. The image sensor of claim 12, further comprising:
first and second scattering structures on the second surface in the pixel region that are configured to scatter the incident light
wherein the first lens extends across the first scattering structure, and
wherein the second lens extends across the second scattering structure.

* * * * *